United States Patent
Mallikarjunaswamy

(10) Patent No.: US 12,211,834 B2
(45) Date of Patent: Jan. 28, 2025

(54) LOW CAPACITANCE TRANSIENT VOLTAGE SUPPRESSOR WITH HIGH HOLDING VOLTAGE

(71) Applicant: Alpha and Omega Semiconductor International LP, Sunnyvale, CA (US)

(72) Inventor: Shekar Mallikarjunaswamy, San Jose, CA (US)

(73) Assignee: Alpha and Omega Semiconductor International LP, Sunnyvale, CA (US)

( * ) Notice: Subject to any disclaimer, the term of this patent is extended or adjusted under 35 U.S.C. 154(b) by 920 days.

(21) Appl. No.: 17/137,310

(22) Filed: Dec. 29, 2020

(65) Prior Publication Data

US 2022/0208750 A1  Jun. 30, 2022

(51) Int. Cl.
*H01L 27/02* (2006.01)
*H02H 9/04* (2006.01)

(52) U.S. Cl.
CPC ...... *H01L 27/0262* (2013.01); *H01L 27/0255* (2013.01); *H01L 27/0292* (2013.01); *H02H 9/046* (2013.01)

(58) Field of Classification Search
CPC ............. H01L 27/0262; H01L 27/0255; H01L 27/0292; H01L 27/0296; H02H 9/046
See application file for complete search history.

(56) References Cited

U.S. PATENT DOCUMENTS

| | | |
|---|---|---|
| 3,609,413 A | 9/1971 | Lane |
| 4,633,283 A | 12/1986 | Avery |
| 6,586,317 B1 | 7/2003 | Vaschenko et al. |
| 6,610,262 B1 | 8/2003 | Peng et al. |
| 7,538,997 B2 | 5/2009 | Mallikararjunaswamy |
| 7,554,839 B2 | 6/2009 | Bobde |
| 7,781,826 B2 | 8/2010 | Mallikararjunaswamy et al. |
| 7,795,987 B2 | 9/2010 | Bobde |
| 7,863,995 B2 | 1/2011 | Ho et al. |
| 7,880,223 B2 | 2/2011 | Bobde |
| 8,218,276 B2 | 7/2012 | Mallikararjunaswamy |
| 8,338,854 B2 | 12/2012 | Bobde et al. |
| 8,338,915 B2 | 12/2012 | Mallikararjunaswamy et al. |
| 8,461,644 B2 | 6/2013 | Bobde et al. |
| 8,698,196 B2 | 4/2014 | Guan et al. |
| 8,742,455 B2 | 6/2014 | Coyne |
| 8,785,971 B2 | 7/2014 | Chuang et al. |
| 8,816,389 B2 | 8/2014 | Coyne |
| 9,230,953 B2 | 1/2016 | Pan et al. |
| 9,385,115 B2 | 7/2016 | Notermans et al. |
| 9,627,372 B2 | 4/2017 | Lai |
| 9,705,026 B2 | 7/2017 | Willemen et al. |
| 9,774,206 B2 | 9/2017 | Kim et al. |
| 10,141,300 B1 * | 11/2018 | Mallikarjunaswamy ..... H01L 29/0649 |
| 10,825,805 B2 * | 11/2020 | Mallikarjunaswamy ..... H01L 29/861 |
| 2007/0008667 A1 | 1/2007 | Steinhoff |
| 2008/0048215 A1 | 2/2008 | Davies |
| 2009/0040670 A1 | 2/2009 | Van Camp et al. |

(Continued)

*Primary Examiner* — Brigitte A Paterson

(57) ABSTRACT

A transient voltage suppressor (TVS) device includes a silicon controlled rectifier (SCR) as the clamp device between a high-side steering diode and a low-side steering diode. The SCR includes alternating emitter and base regions arranged interleaving in a direction along a major surface of a semiconductor layer and orthogonal to a current path of the SCR. The TVS device realizes low capacitance and high holding voltage at the protected node.

22 Claims, 16 Drawing Sheets

(56) References Cited

U.S. PATENT DOCUMENTS

| | | |
|---|---|---|
| 2009/0045436 A1 | 2/2009 | Verleye et al. |
| 2009/0115018 A1 | 5/2009 | Mallikarjunaswamy |
| 2009/0237847 A1 | 9/2009 | Ryu et al. |
| 2010/0181643 A1 | 7/2010 | Kothandaraman et al. |
| 2010/0244090 A1 | 9/2010 | Bobde et al. |
| 2011/0210595 A1 | 9/2011 | Hu et al. |
| 2012/0091504 A1 | 4/2012 | Davis et al. |
| 2012/0293904 A1 | 11/2012 | Salcedo et al. |
| 2013/0229223 A1 | 9/2013 | Shrivastava et al. |
| 2014/0138735 A1 | 5/2014 | Clarke et al. |
| 2014/0167099 A1 | 6/2014 | Mergens |
| 2014/0167101 A1 | 6/2014 | Bobde et al. |
| 2015/0123240 A1 | 5/2015 | Bowman et al. |
| 2016/0104700 A1 | 4/2016 | Notermans et al. |
| 2017/0012036 A1 | 1/2017 | Quax et al. |
| 2017/0084601 A1 | 3/2017 | Yao et al. |
| 2017/0092760 A1 | 3/2017 | Parris et al. |
| 2017/0117267 A1 | 4/2017 | De Raad et al. |
| 2017/0317070 A1 | 11/2017 | Salcedo et al. |

\* cited by examiner

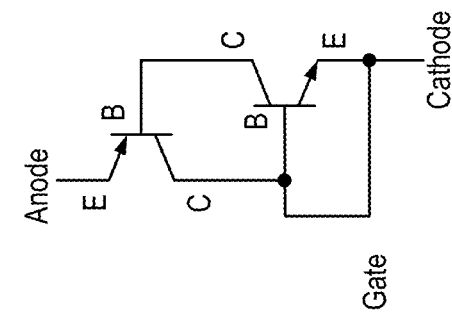
FIG. 7(b)
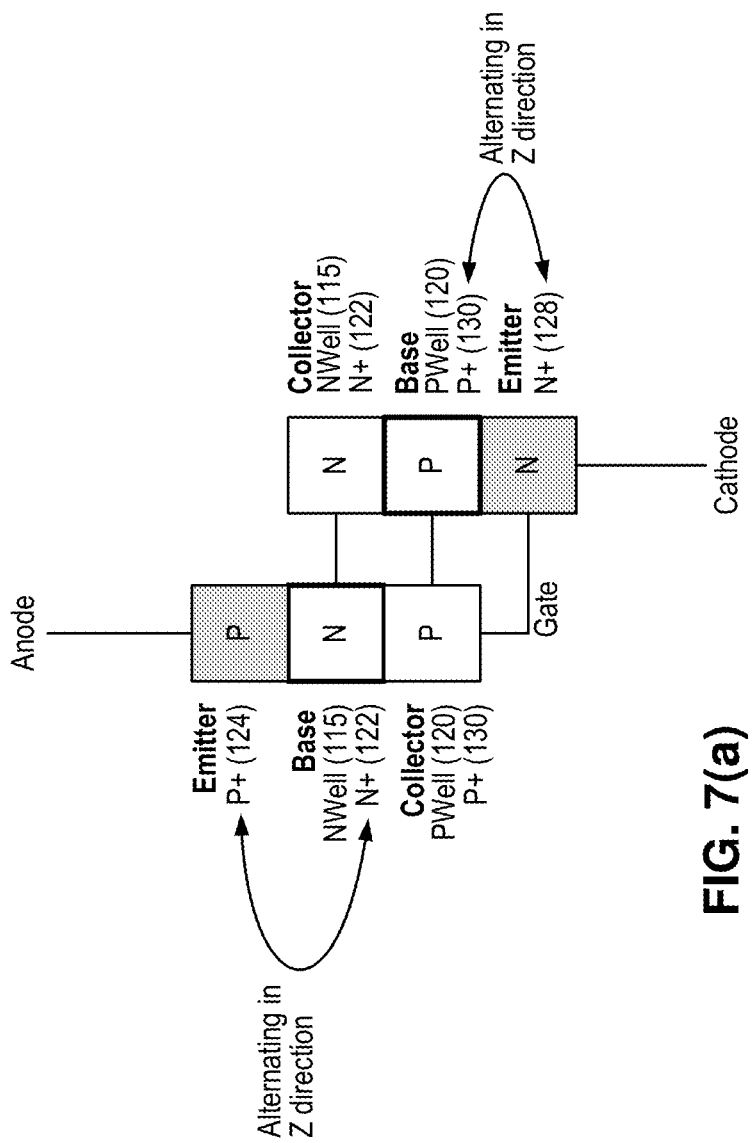
FIG. 7(a)
FIG. 7

LOW CAPACITANCE TRANSIENT VOLTAGE SUPPRESSOR WITH HIGH HOLDING VOLTAGE

BACKGROUND OF THE INVENTION

Voltage and current transients are major causes of integrated circuit failure in electronic systems. Transients are generated from a variety of sources both internal and external to the system. For instance, common sources of transients include normal switching operations of power supplies, AC line fluctuations, lightning surges, and electrostatic discharge (ESD).

Transient voltage suppressors (TVS) are commonly employed for protecting integrated circuits from damages due to the occurrences of transients or over-voltage conditions at the integrated circuit. Over-voltage protection are important for consumer devices or the Internet of Things devices as these electronic devices are exposed to frequent human handling and, as a result, may be susceptible to ESD or transient voltage events that may damage the devices.

In particular, the power supply pins and the data pins of the electronic devices both require protection from over-voltages conditions due to ESD events or switching and lightning transient events. Typically, the power supply pins need high surge protection but can tolerate protection devices with higher capacitance. Meanwhile, the data pins, which may operate at high data speed, requires protection devices that provide surge protection with low capacitance so as not to interfere with the data speed of the protected data pins.

Existing TVS protection solution applied to input/output (I/O) terminals in high speed applications exist both in vertical and lateral type of semiconductor circuit structures. In the unidirectional TVS, the I/O current during an ESD event flows through a low capacitance high side steering diode into a large reverse blocking junction or the current flows through the low capacitance low side steering diode to ground. In the case of bidirectional TVS protection, low capacitance is achieved by connecting a low capacitance forward biased diode in series with a large reversed biased junction for blocking.

HDMI (High-Definition Multimedia Interface) is a high speed digital audio/video interface for transmitting digital audio/video data between HDMI-compliant devices. HDMI connectors in electronic devices are provided with over-voltage transient protection devices to protect against over-voltage events, such as ESD due to frequent human handling.

BRIEF DESCRIPTION OF THE DRAWINGS

Various embodiments of the invention are disclosed in the following detailed description and the accompanying drawings.

FIG. 1, which includes

FIG. 5 is a top view of a TVS protection device in embodiments of the present invention.

FIG. 7, which includes FIGS. 7(a) and 7(b), includes a physical diagram and an equivalent circuit schematic of the SCR clamp device in embodiments of the present disclosure.

DETAILED DESCRIPTION

Figure 1A:
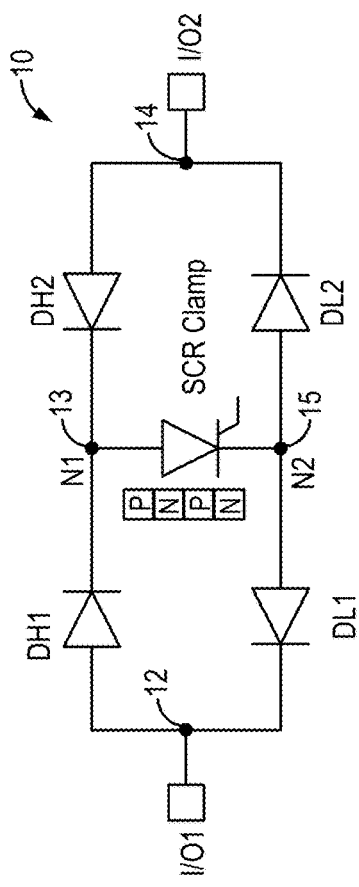
FIG. 1(a) to FIG. 1(c), illustrates circuit diagrams of SCR based TVS protection devices in embodiments of the present disclosure.

In embodiments of the present disclosure, a transient voltage suppressor (TVS) device includes a silicon controlled rectifier (SCR) as the clamp device between a high-side steering diode and a low-side steering diode. The SCR includes alternating emitter and base regions arranged interleaving in a direction along a major surface of a semiconductor layer and orthogonal to a current path of the SCR. In some embodiments, the SCR includes alternating emitter and base regions forming the PNP and NPN bipolar transistors of the PNPN structure of the SCR. The TVS device of the present disclosure realizes low capacitance at the protected node in the blocking mode while providing a high holding voltage in the conduction mode. For example, the TVS device of the present disclosure can realize a holding voltage greater than an operating voltage associated with the protected node.

HDMI applications require a transient voltage protection device to have low capacitance in order not to interfere with the data speed of the protected pins. HDMI applications also require the protection device to have a holding voltage (DC) beyond the maximum operating voltage of the HDMI coupled device. Conventional solutions to such requirements include using non-snapback TVS diode for I/O protection. Conventional SCR based TVS protections have deep snap-back characteristics that do not allow them to be used in HDMI applications as the holding voltage after snap-back is often lower than the maximum operating voltage of the HDMI coupled device.

The TVS device of the present disclosure is particularly suitable for providing transient voltage protection in HDMI applications where the TVS device offers both low capacitance at the protected node in blocking mode and high holding voltage after snap-back in the conduction mode. In embodiments of the present disclosure, the TVS device is a SCR based TVS protection device. The SCR based TVS device realizes a low capacitance value, such as less than 0.2 pF, at the protected node while providing a high holding voltage above the maximum operating voltage of the HDMI coupled device. The TVS device of the present disclosure can be advantageously applied to protect high-speed data pins or input-output (I/O) terminals in high speed electronic applications, such as data ports or connectors implementing the HDMI 2.1 specification.

In the present description, a transient voltage suppressor (TVS) protection device refers to a protection device to protect a protected node from over-voltage transient conditions, such as voltage surges or voltage spikes. The TVS protection device ("TVS device") operates by shunting the excess current from the protected node when a surge voltage exceeding the trigger voltage of the TVS device is applied to the protected node. The TVS device can include a clamp device for clamping the voltage at the protected node at a clamping voltage much lower than the voltage value of the voltage surge while safely conducting away the surge current.

A TVS device can be either a unidirectional device or a bidirectional device. A unidirectional TVS device has an asymmetrical current-voltage characteristic and is typically used for protecting circuit nodes whose signals are unidirectional—that is, the signals are always above or below a certain reference voltage, such as ground. For example, a unidirectional TVS device may be used to protect a circuit node whose normal signal is a positive voltage from 0V to 5V. On the other hand, a bidirectional TVS device has a symmetrical current-voltage characteristics and is typically used for protecting circuit nodes whose signals are bidirectional or can have voltage levels both above and below the reference voltage, such as ground. For example, a bidirectional TVS device may be used to protect a circuit node whose normal signal varies symmetrically above and below ground, such as from −12V to 12V. In this case, the bidirectional TVS device protects the circuit node from a surge voltage that goes below −12 V or above 12V.

In operation, the TVS device is in a blocking mode and is non-conductive except for possible leakage current when the voltage at the protected node is below the trigger voltage of the TVS device. That is, when the voltage at the protected node is within the normal voltage range for the protected node, the TVS device is non-conductive and is in blocking mode. However, during the blocking mode, the TVS device presents a capacitance to the protected node. When the protected node is associated with a high speed data pin, the capacitance of the TVS device in the blocking mode or non-conductive mode should be low so as not to impede the high speed operation of the data pin. In some embodiments, the TVS device of the present disclosure realizes a low capacitance value of less than 0.2 pf in the blocking mode. On the other hand, in response to the voltage at the protected node being at or above the trigger voltage of the TVS device, the TVS device enters the conductive mode and snap-back to a holding voltage so that the TVS device conduct away the excessive current at the holding voltage which is much lower than voltage surge at the protected node.

Figure 1B:
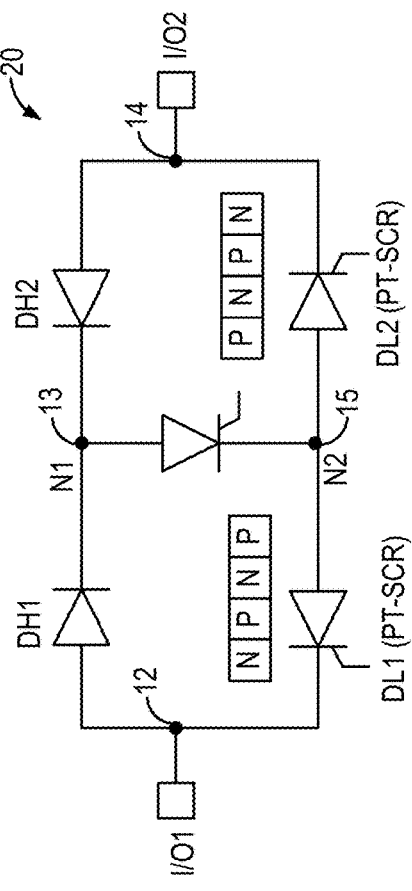
Figure 1C:
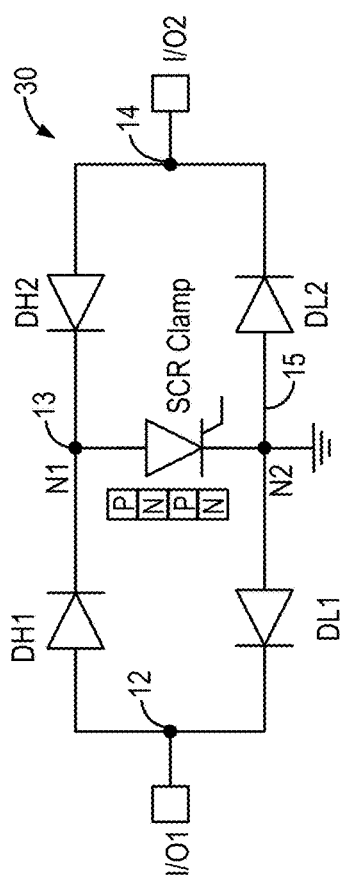

FIG. 1, which includes FIG. 1(a) to FIG. 1(c), illustrates circuit diagrams of SCR based TVS protection devices in embodiments of the present disclosure. FIGS. 1(a) to 1(c) illustrate various configuration of the SCR based TVS device that can be constructed in accordance with embodiments of the present disclosure.

FIG. 1(a) is a circuit diagram of a bidirectional TVS protection device in embodiments of the present disclosure. Referring to FIG. 1(a), a TVS protection device 10 ("TVS device 10") includes two sets of steering diodes coupled to provide surge protection for two input-output (I/O) terminals I/O1 and I/O2. Each set of steering diodes include a high-side steering diode and a low-side steering diode. More specifically, a high-side steering diode DH1 and a low-side steering diode DL1 are coupled to the I/O terminal I/O1 (node 12) as the protected node. Meanwhile, a high-side steering diode DH2 and a low-side steering diode DL2 are coupled to the I/O terminal I/O2 (node 14) as the protected node. The I/O terminal I/O1 is connected to the anode of the high-side steering diode DH1 and to the cathode of the low-side steering diode DL1. Similarly, the I/O terminal I/O2 is connected to the anode of the high-side steering diode DH2 and to the cathode of the low-side steering diode DL2. The cathode terminal of the high-side steering diode DH1 is connected to a node N1 (node 13) which also connects to the cathode of the high-side steering diode DH2. The anode terminal of the low-side steering diode DL1 is connected to a node N2 (node 15) which is also the anode of the low-side steering diode DL2.

The TVS device 10 further includes a clamp device implemented as a silicon controlled rectifier (SCR). The anode of the SCR clamp device is connected to node N1 (node 13) while the cathode of the SCR clamp device is connected to node N2 (node 15). The SCR clamp device of the TVS device 10 clamps the voltage at the protected node I/O1 or I/O2 at the holding voltage while the TVS device conducts current safely out of the protected node.

In embodiments of the present disclosure, the high-side steering diodes DH1 and DH2 are each implemented as a PN junction diode with low capacitance at the anode terminal during the blocking mode. In embodiments of the present disclosure, the low-side steering diodes DL1 and DL2 of the TVS device 10 are each implemented as a PN junction diode with low capacitance at the cathode terminal during the blocking mode. In alternate embodiments, as shown in FIG. 1(b), the low-side steering diodes DL1 and DL2 of the TVS device 20 are each implemented using a punch-through silicon controlled rectifier structure (referred herein as "PT-SCR"). A PT-SCR structure which can be used to implement the low-side steering diodes in the TVS device of the present disclosure is described in U.S. Pat. No. 10,825,805, entitled "Low Capacitance Transient Voltage Suppressor Including A Punch-Through Silicon Controlled Rectifier As Low-Side Steering Diode," by the same inventor hereof, issued Nov. 3, 2020, which patent is incorporated herein by reference in its entirely. The low-side steering diode DL1 and DL2 in the TVS device of the present disclosure can also be constructed using other suitable device structures, presently known or to be developed.

In the present description, a SCR is a current-controlling device including four layers or regions of alternating P-type and N-type semiconductor materials, forming NPNP or PNPN structures. The anode of an SCR is the outermost p-type layer of the NPNP or PNPN structure, and the cathode is the outermost n-type layer of the NPNP or PNPN structure. A typical SCR includes a gate terminal which is connected to the p-type layer nearest to the cathode. An SCR can be symbolized as a PN junction diode with a gate terminal at the cathode terminal. In an equivalent circuit diagram, the PNPN structure of the SCR forms a cross-connected PNP and NPN bipolar transistors. The emitter of the PNP transistor is the anode of the SCR and the emitter of the NPN transistor is the cathode of the SCR.

In embodiments of the present disclosure, the SCR is configured as a two-terminal device where the gate terminal is electrically connected to the cathode terminal. The SCR is in the blocking mode (forward or reverse) when the voltage applied between the anode or cathode terminals is below the breakdown voltage of the junction between the inner P and N regions ("the inner PN junction"). In the blocking mode, only a leakage current may flow in the SCR. On the other hand, the SCR is turned on to conduct current when a voltage applied between the anode and cathode terminals exceeds the forward or reverse breakdown voltage of the SCR. In that case, the inner PN junction breaks down and charge carriers (holes or electrons) generated from the avalanche breakdown flows to the base contacts next to the emitters (the N+ cathode and P+ anode of the SCR). The avalanche current increases to a sufficient level, the NPN bipolar transistor is turned on (or the PNP bipolar transistor is turned on). The PNP bipolar transistor is turned on due to positive feedback from the NPN bipolar transistor, or vice versa. The SCR is in the on-state when both the NPN and the PNP transistors are turned on. When the SCR is turned on, the SCR voltage snaps back to conduct current at a holding voltage lower than the breakdown voltage.

As used herein, a punch-through silicon controlled rectifier refers to an SCR where the n-type region between two p-type regions is substantially depleted at a bias voltage of zero volt. That is, the two p-type regions separated by the n-type region are electrically shorted together at zero volt bias voltage due to the depletion of the n-type region. The PT-SCR structure ensures low capacitance at the protected node.

The operation of the bi-directional TVS devices of FIGS. 1(a) and 1(b) is as follows. When a positive zap is applied to I/O terminal I/O1 with respect to I/O terminal I/O2, the current flows from terminal I/O1 through diode DH1 and the SCR clamp device, through diode DL2 (which can be a PT-SCR device) and into terminal I/O2. Similarly, when a negative zap is applied to I/O terminal I/O1 with respect to I/O terminal I/O2, which is equivalent to a positive zap on terminal I/O2 with respect to terminal I/O1, the current flows from terminal I/O2 through diode DH2 and the SCR clamp device, through diode DL1 (which can be a PT-SCR) and into terminal I/O1.

In other words, a positive zap voltage applied to either of the I/O terminals will forward bias the high-side steering diode (DH1 or DH2) of the I/O terminal being zapped and when the zap voltage reaches or exceeds the breakdown voltage (BV) of the SCR clamp device, the zap current triggers the SCR and the SCR turns on to conduct the current. The zap current exits through the other I/O terminal. A negative zap voltage applied to either of the I/O terminals will result in the same current conduction operation as if a positive zap voltage is applied to the other I/O terminal.

FIG. 1(c) is a circuit diagram of a unidirectional TVS protection device in embodiments of the present disclosure. Referring to FIG. 1(c), a unidirectional TVS protection device 30 ("TVS device 30") can be constructed from the bidirectional TVS device 10 of FIG. 1(a) by grounding node N2 (node 15), or the cathode terminal of the SCR clamp device. That is, node N2 is connected to the ground potential. As thus configured, zap current from over-voltage transient events applied to either of the I/O terminals will flow to the ground node.

In particular, a positive zap voltage applied to either of the I/O terminals will forward bias the high-side steering diode (DH1 or DH2) of the I/O terminal being zapped and when the zap voltage reaches or exceeds the breakdown voltage of the SCR clamp device, the zap current triggers the SCR and the SCR turns on to conduct the current. The zap current exits through the ground node 15. A negative zap voltage applied to either of the I/O terminals will result in the same current conduction operation as if a positive zap voltage is applied to the other I/O terminal.

The embodiments shown in FIGS. 1(a) to 1(c) illustrate TVS protection devices connected to two I/Os or channels, in bidirectional mode or unidirectional mode. In other embodiments, the TVS device of the present disclosure can be configured for multiple channels, such as four or more channels. In one embodiment of the present disclosure, a TVS device is configured for four I/O terminals or four channels, where one pair of channels can be coupled to one pair of differential signal and another pair of channels can be coupled to another pair of differential signal. A TVS device with four channels is advantageous for application in an HDMI connector for protecting pairs of differential signals in the HDMI connector. In the case of HDMI applications, the TVS device is usually in a unidirectional configuration with the cathode of the SCR clamp device connected to the ground potential, such as the TVS device 30 of FIG. 1(c).

Figure 2:
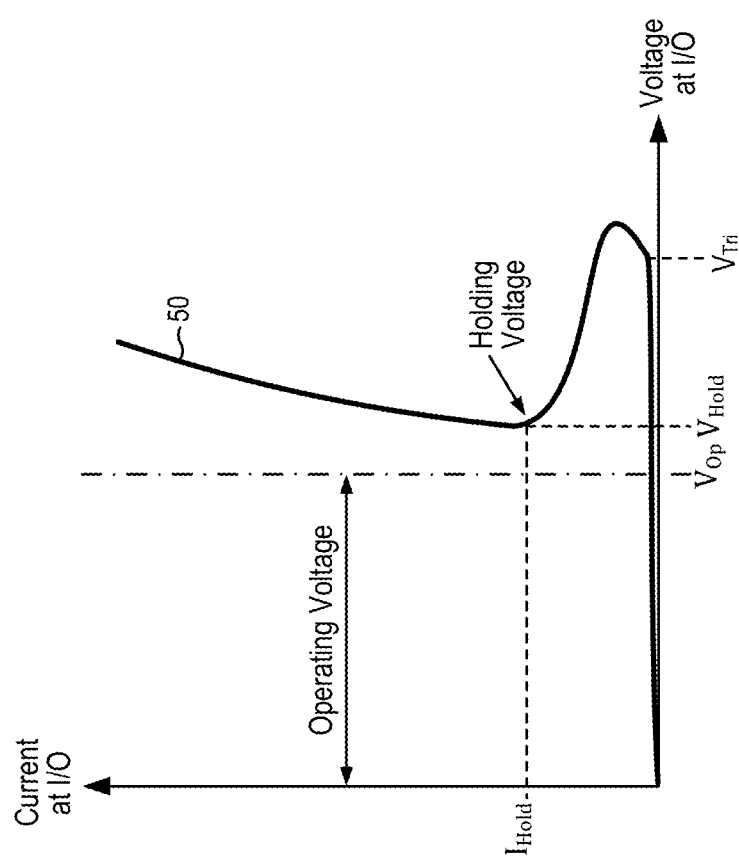
FIG. 2 illustrates the current-voltage characteristics of the TVS protection device in embodiments of the present disclosure.

FIG. 2 illustrates the current-voltage characteristics of the TVS protection device in embodiments of the present disclosure. Referring to FIG. 2, the curve 50 depicts the current conducted through the TVS device versus the voltage applied at the protected node. In the present illustration, only the forward conduction mode of the TVS device is shown. It is instructive to note that the current-voltage characteristics of the TVS device shown in FIG. 2 is representative of the current-voltage characteristics of the SCR clamp device incorporated in the TVS device.

In normal operation, the voltage at the protected node should be within the operating voltage range (less than $V_{Op}$) and the TVS device is in the blocking mode, not conducting any current except for leakage current. If the voltage at the protected node exceeds the trigger voltage ($V_{Tri}$) of the TVS device, the TVS device is turned on to conduct current—that is, the TVS device is in the conduction mode. When the voltage at the protected node exceeds the trigger voltage, the SCR clamp device in the TVS device breaks down and enters snap-back. As a result, the SCR of the TVS device clamps the voltage at the protected node at the holding voltage ($V_{Hold}$) while the TVS device conducts current safely out of the protected node. In the present description, the trigger voltage $V_{Tri}$ of the TVS device refers to a voltage level where the inner PN junction of the SCR enters breakdown due to the voltage at the protected node and one of the NPN and PNP bipolar transistors in the SCR of the TVS device is turned on. When both bipolar transistors in the SCR are turned on, the TVS device is in full conduction mode and enters snap-back to clamp the voltage at the protected node.

In embodiments of the present disclosure, the TVS device is designed to have a holding voltage $V_{Hold}$ that is greater than the maximum operating voltage $V_{Op}$ associated with the protected node. For example, the operating voltage at the protected node may be 3.3V and the TVS device of the present disclosure has a holding voltage at 3.6V. In another example, the operating voltage at the protected node may be 5V and the TVS device has a holding voltage at 5.5V. In particular, it is desirable for the TVS device to have a holding voltage greater than the operating voltage so that even if the TVS device is triggered, the TVS device is holding at a voltage that is higher than the operating voltage and would not divert current from the protected node.

In embodiments of the present invention, the TVS device incorporates structures to adjust or tune the trigger voltage $V_{Tri}$ of the TVS device to the desired voltage level while preserving the low parasitic capacitance and high holding voltage characteristics of the TVS device. For example, in some cases, the trigger voltage $V_{Tri}$ of the TVS device may be adjusted so as to make the TVS device more sensitive to voltage surge. Structures for adjusting the trigger voltage of the TVS device will be described in more detail below.

According to embodiments of the present disclosure, a low capacitance and high holding voltage SCR based TVS device is constructed using alternating emitter and base regions arranged interleaving in a direction orthogonal to the current flow of the SCR. The TVS device thus formed can be configured for bidirectional mode by leaving the SCR cathode terminal floating or for unidirectional mode by connecting the SCR cathode terminal to the ground potential. The bidirectional or unidirectional configuration of the TVS device is not critical to practice of the TVS device of the present disclosure. In the following description, the cross-sectional views of the various embodiments of the TVS device does not illustrate the particular connection of the SCR cathode terminal. It is understood that the SCR cathode terminal can be connected in a manner necessary to form a bidirectional or a unidirectional TVS device. Furthermore, in the following description, the cross-sectional views of the various embodiments of the TVS device does not illustrate the low-side steering diode. It is understood that the TVS device includes a low-side steering diode which can be implemented as a low capacitance PN junction diode or a PT-SCR, as described above.

Figure 3:
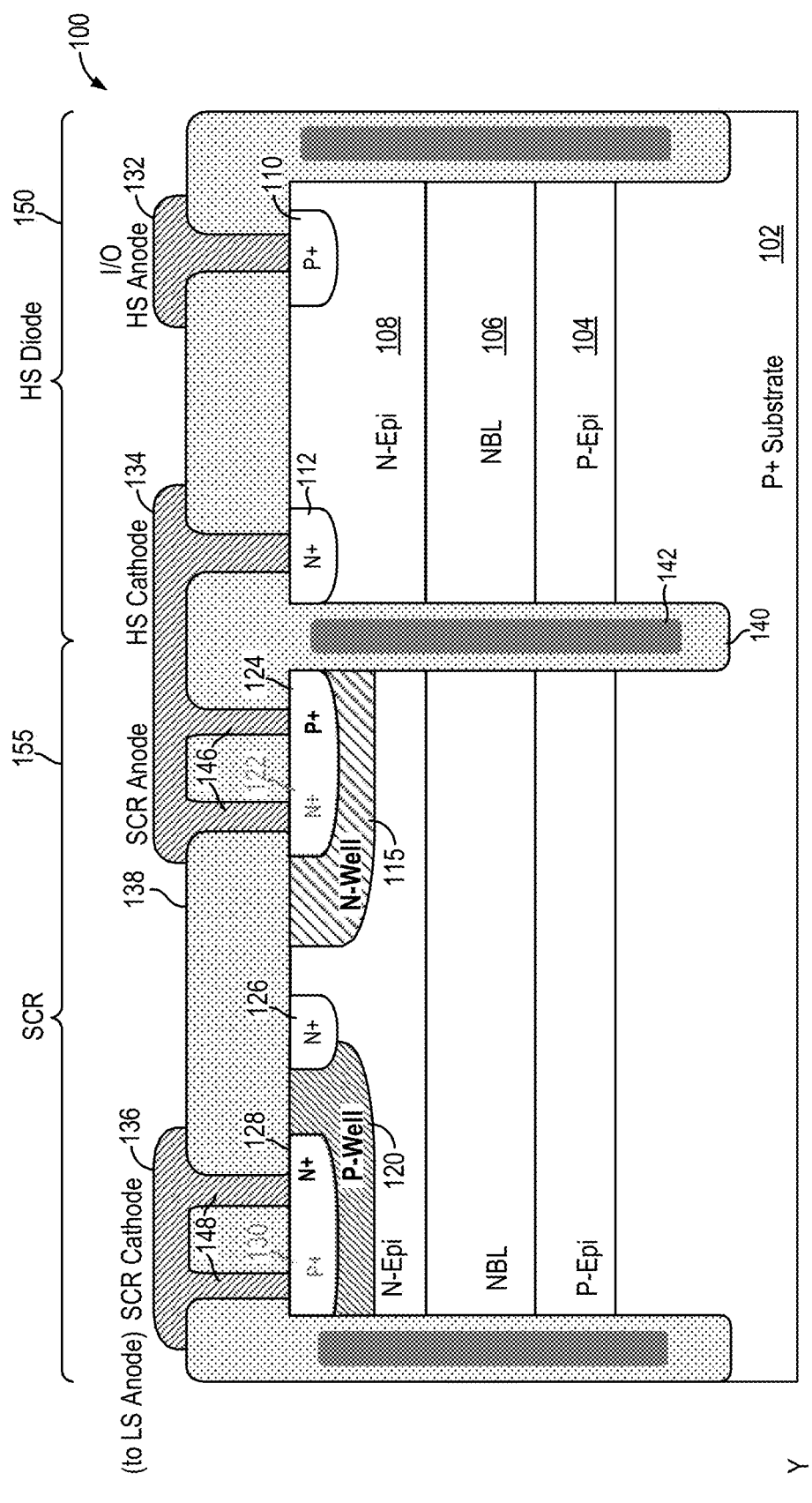
FIG. 3 is a cross-sectional view of a TVS protection device in embodiments of the present disclosure.

FIG. 3 is a cross-sectional view of a TVS protection device in embodiments of the present disclosure. In particular, FIG. 3 illustrates the cross-sectional view of the high-side steering diode ("HS diode") and the SCR clamp device of the TVS protection device. For instance, the high-side steering diode and the SCR clamp device in FIG. 3 can be used to form the TVS protection devices in FIG. 1. In the present figure, the low-side steering diode is omitted to simplify the discussion. It is understood that FIG. 3 illustrates only a part of the TVS protection device and that the TVS protection device includes other elements not shown in the cross-sectional view of FIG. 3.

Referring to FIG. 3, the TVS protection device 100 ("TVS device 100") is fabricated on a P+ substrate 102. In the present embodiment, a P-type epitaxial layer 104 is formed on the P+ substrate 102. Then, an N-type buried layer (NBL) 106 is formed on the P-type epitaxial layer 104. An N-type epitaxial layer (N-Epi layer) 108 is formed on the N-type buried layer 106. The semiconductor structure for forming the TVS device is thus constructed.

In the present embodiment, trench isolation structures 140 are used to define and isolate regions of the semiconductor structure for forming the separate circuit elements. In particular, the trench isolation structures 140 divide the semiconductor structure into several active regions. In the present embodiment, the trench isolation structures 140 are formed as oxide lined trenches filled with a polysilicon layer 142 and the trenches extend to the P+ substrate 102. In other embodiments, the trench isolation structures 140 can be formed as oxide filled trenches.

With the trench isolation structures 140 thus formed, active regions in the semiconductor structure for forming the high-side steering diode 150 and the SCR clamp device 155 are defined. For example, the high-side steering diode 150 maybe formed in a first active region and the SCR clamp device 155 maybe formed in a second active region. In the present embodiment, the high-side steering diode (HS Diode) 150 is formed as a PN junction diode with the anode formed by a heavily doped P+ region 110 and the cathode formed by a heavily doped N+ region 112, both formed spaced apart in the N-type epitaxial layer 108. As thus configured, the TVS device 100 presents low capacitance to the I/O terminal connected to the P+ region 110 because the N-type epitaxial layer 108 is lightly doped.

A metal contact 132 is made in the dielectric layer 138 to contact the P+ region 110 to form the anode terminal of the high-side steering diode 150. Meanwhile, another metal contact 134 is made in the dielectric layer 138 to contact the N+ region 112 to form the cathode terminal of the high-side steering diode 150. For the high-side steering diode 150, the anode terminal 132 is connected to I/O terminal as the protected node and the cathode terminal 134 is connected to the node N1 which is then connected to the anode of the SCR clamp device 155.

In embodiments of the present disclosure, the SCR clamp device 155 (SCR or SCR device) is formed as an PNPN structure including a heavily doped P+ region 124 formed in an N-Well 115 and a heavily doped N+ region 128 formed in a P-Well 120. The N-Well 115 and the P-Well 120 are formed in the N-type epitaxial layer 108 and are spaced apart from each other in a first direction (e.g. the X direction) on a major surface of the semiconductor structure. The first direction (X direction) is also the direction of current flow (or the current path) of the SCR clamp device 155. The SCR clamp device 155 further includes a heavily doped N+ region 122 formed in the N-Well 115 and a heavily doped P+ region 130 formed in the P-Well 120.

In embodiments of the present disclosure, the SCR device 155 is formed by interleaving the emitter and base regions of the PNP bipolar transistor and the NPN bipolar transistor forming the PNPN structure. In particular, the emitter and base regions for each bipolar transistor are arranged as alternating doped regions in the respective well region interleaving along a second direction (e.g. the Z direction) on the major surface of the semiconductor structure and orthogonal to the first direction (X direction). In other words, the SCR device 155 includes emitter-base regions that are interleaving in a direction orthogonal to the current path of the SCR or orthogonal to the direction of current flow of the SCR. In FIG. 3, the emitter and base regions for each bipolar transistor are depicted using black ink and gray ink to illustrate the alternating doped regions in the Z direction. For example, black ink and gray ink are used to depict N+ region 128 and P+ region 130 as alternating doped regions in the Z direction in the cross-sectional view in the X-Y plane. In the present illustration, the gray ink denotes a doped region that is formed behind the doped region in black ink in the second (Z) direction. Furthermore, the interleaving is arranged so that the P+ emitter region of the PNP bipolar transistor is coplanar with the N+ emitter region of the NPN bipolar transistor in the second direction (Z direction) and further the N+ base body contact region of the PNP bipolar transistor is coplanar with the P+ base body contact region of the NPN bipolar transistor in the second direction (Z direction). The SCR clamp device 155 realizes a high holding voltage by using the interleaving emitter-base regions in a direction orthogonal to the SCR current path.

A metal contact 146 is made in the dielectric layer 138 to contact the P+ region 124 and the N+ region 122 to form the anode terminal of the SCR 155. Meanwhile, another metal contact 148 is made in the dielectric layer 138 to contact the N+ region 128 and the P+ region 130 to form the cathode terminal of the SCR 155. The anode terminal 146 of the SCR is connected to the cathode of the high-side diode 150 and the cathode terminal 136 of the SCR is connected to the anode terminal of the low-side steering diode (not shown). To form a unidirectional TVS device, the cathode terminal 136 of the SCR 155 may further be connected to the ground potential.

As thus constructed, the P+ region 124 in the N-Well 115 is the cathode of the SCR, the N+ region 128 in the P-Well 120 is the anode of the SCR, the N+ region 122 in the N-Well 115 is the body contact for the N-Well, and the P+ region 130 in the P-Well 120 is the body contact for the P-Well. The PNPN structure of the SCR device 155 is formed by the P+ region 124, the N-Well 115, the P-Well 120 and the N+ region 128. More specifically, the SCR device 155 includes a PNP bipolar transistor and an NPN bipolar transistor forming the PNPN structure. In SCR 155, the PNP bipolar transistor is formed by P+ region 124 as the emitter, N-Well 115/N+ region 122 as the base (the N+ region 122 being the body contact for the base), and P-Well 120 as the collector. Meanwhile, the NPN bipolar transistor is formed by N+ region 128 as the emitter, P-Well 120/P+ region 130 as the base (the P+ region 130 as the body contact for the base), and N-well 115 as the collector.

Figure 4:
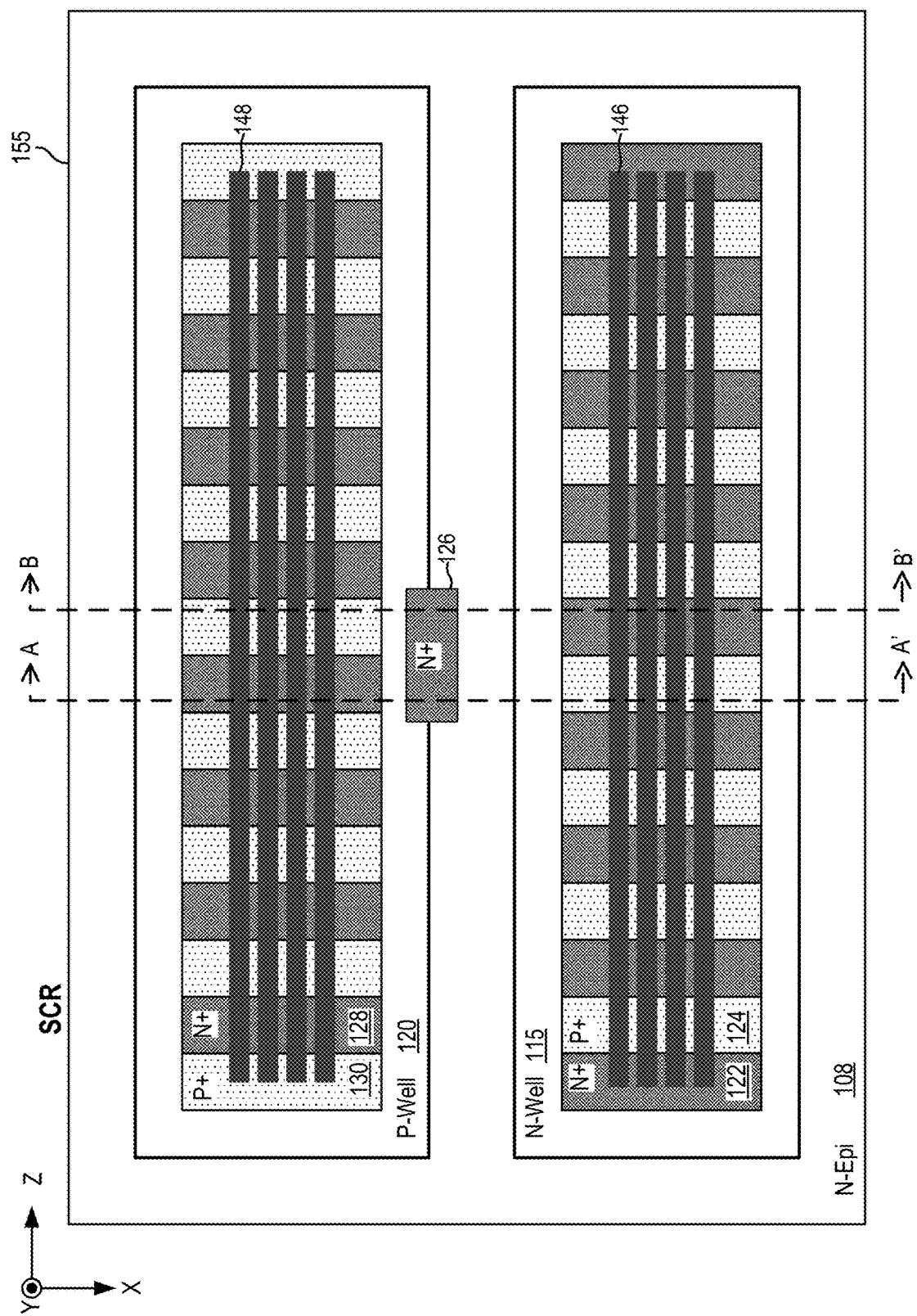
FIG. 4 is a layout view of the SCR device in the TVS protection device of FIG. 3 in some embodiments.

FIG. 4 is a layout view of the SCR device in the TVS protection device of FIG. 3 in some embodiments. Like elements in FIGS. 3 and 4 are given like reference numerals to simplify the discussion. In particular, the layout view illustrates the SCR device as viewed from a third direction (e.g. the Y direction) orthogonal to both the first and second directions. The layout view in FIG. 4 illustrates the structures of the SCR formed in the X-Z plane and illustrates more particular the arrangement of the alternating emitter and base regions in the SCR device. It is instructive to note that the layout view in FIG. 4 illustrates the placement of certain regions and structures of the TVS device and other regions or structures of the TVS device are omitted for simplicity. For example, the isolation structures are omitted from the layout view in FIG. 4. FIG. 4 is illustrative only and is not intended to be limiting.

Referring to FIG. 4, the SCR device 155 is formed in an active region of the N-type epitaxial layer 108, isolated from other active regions by isolation structures (not shown). The P-Well 120 and the N-Well 115 are arranged as adjacent regions in the X direction (first direction). In P-Well 120, the P+ region 130 forming the base body contact and the N+ region 128 forming the emitter of the NPN bipolar transistor are formed as striped doped regions arranged alternately or interleaving in the Z direction (second direction). In N-Well 115, the N+ region 122 forming the base body contact and the P+ region 124 forming the emitter of the PNP bipolar transistor are formed as striped doped regions arranged alternately or interleaving in the Z direction (second direction).

Furthermore, the interleaving is arranged so that the N+ region 122 in the N-Well 115 is coplanar with the P+ region 130 in the P-Well 120 in the second direction (Z direction). Similarly, the P+ region 124 in N-Well 115 is coplanar with the N+ region 128 in the P-Well 120 in the second direction (Z direction). In the present description, two regions are coplanar in the second direction when the two regions are aligned in the second (Z) direction while positioned spaced apart in the first (X) direction, as illustrated in FIGS. 5 and 6.

Figure 5:
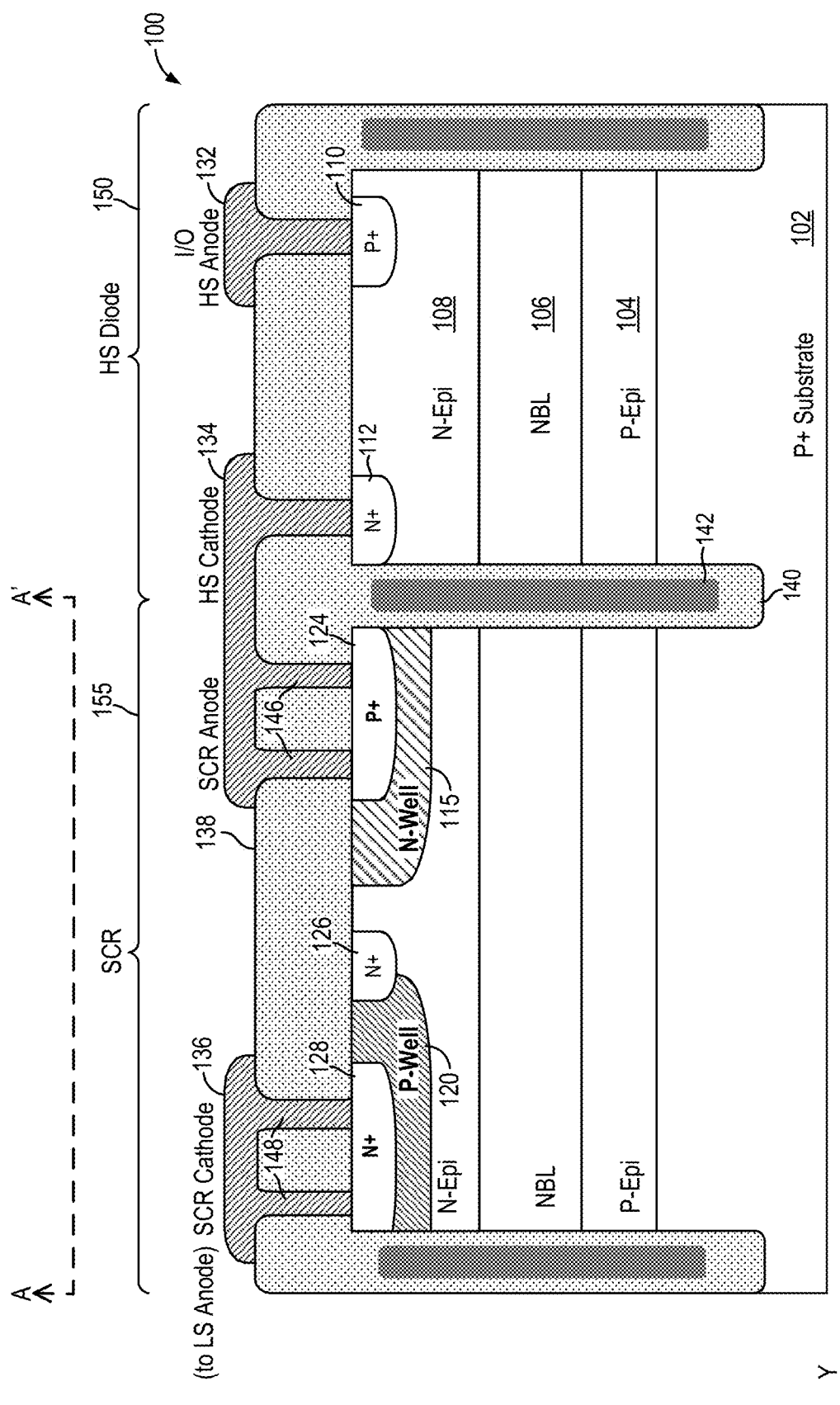
FIG. 5 is a cross-sectional view of the TVS protection device in FIGS. 3 and 4 along the line A-A' in embodiments of the present disclosure.
Figure 6:
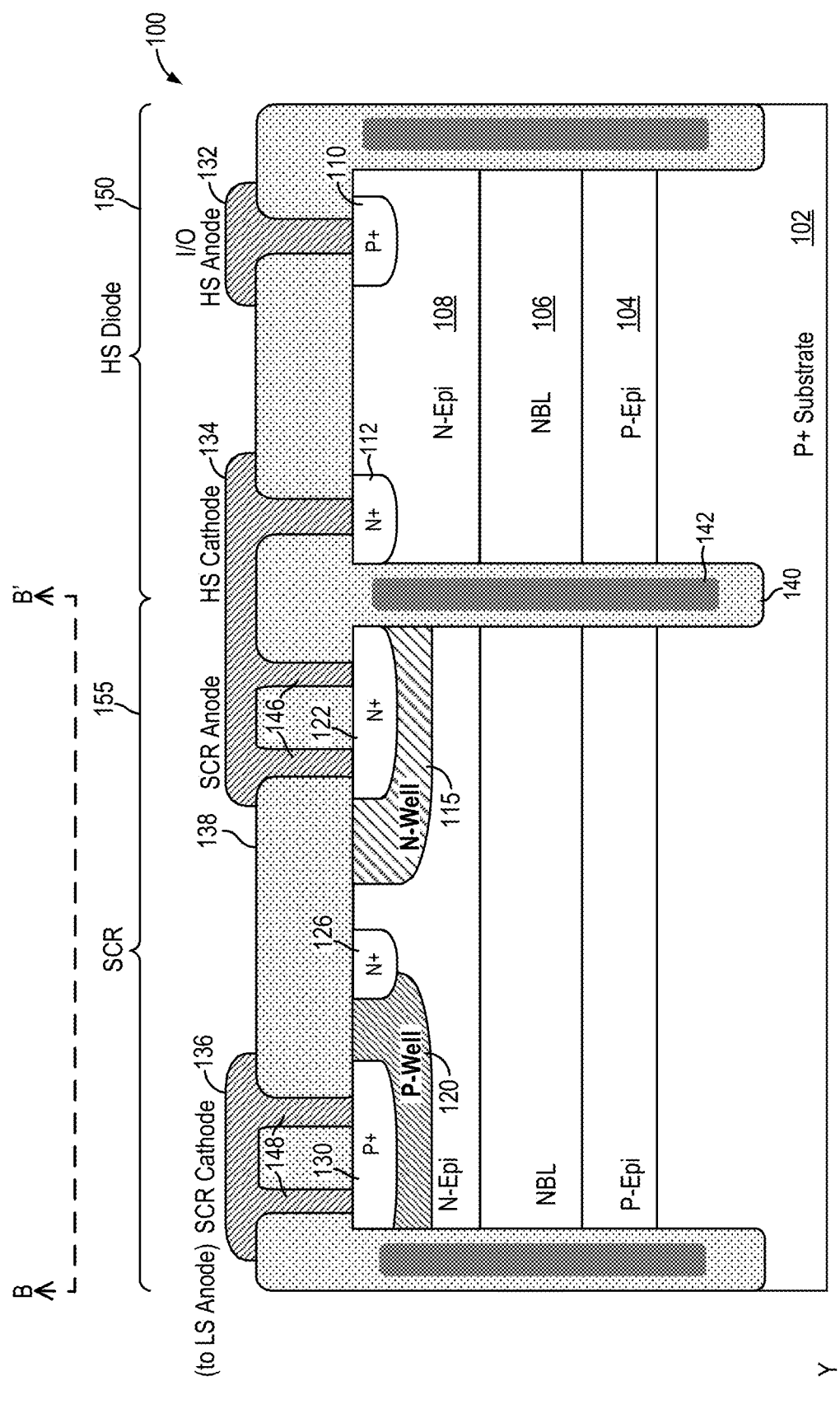
FIG. 6 is a cross-sectional view of the TVS protection device in FIGS. 3 and 4 along the line B-B' in embodiments of the present disclosure.

FIG. 5 is a cross-sectional view of the TVS protection device in FIGS. 3 and 4 along the line A-A' in embodiments of the present disclosure. FIG. 6 is a cross-sectional view of the TVS protection device in FIGS. 3 and 4 along the line B-B' in embodiments of the present disclosure. Referring first to FIG. 5, along the line A-A', the SCR device 155 includes the P+ region 124 in the N-Well 115 and the N+ region 128 in the P-Well 120, forming the PNPN structure of the SCR 155. The P+ region 124 and the N+ region 128 are aligned in the Z direction and are therefore coplanar in the Z direction. Referring now to FIG. 6, along the line B-B', the SCR device 155 includes the N+ region 122 in the N-Well 115 and the P+ region 130 in the P-Well 120, forming the base body contacts of the PNPN structure of the SCR 155. The N+ region 122 and the P+ region 130 are aligned in the Z direction and are therefore coplanar in the Z direction. As thus configured, the SCR device 155 is formed by alternating emitter and base regions arranged interleaving in the Z direction orthogonal to a current path of the SCR in the X direction.

The NPN and PNP bipolar transistors in the SCR device 155 are further illustrated in more details to explain the alternating emitter and base regions. FIG. 7, which includes FIGS. 7(a) and 7(b), includes a physical diagram and an equivalent circuit schematic of the SCR clamp device in embodiments of the present disclosure. Referring to FIG. 7(a), the PNPN structure of the SCR device 155 includes an PNP bipolar transistor and an NPN bipolar transistor. The PNP bipolar transistor is formed by the P+ region 124 as the emitter, the N-Well 115/N+ region 122 as the base and body contact, and the P-Well 120/P+ region 130 as the collector. Meanwhile, the NPN bipolar transistor is formed by the N+ region 128 as the emitter, the P-Well 120/P+ region 130 as the base and body contact, and the N-Well 115/N+ region 122 as the collector. The NPN and PNP bipolar transistors share the N-Well 115/N+ region 122 as well as the P-Well 120/P+ region 130. Furthermore, the gate terminal (P-Well 120) of the SCR is electrically connected to the cathode (N+ 128) to form a two-terminal SCR device. The resultant circuit diagram of the cross-connected NPN and PNP bipolar transistors is shown in FIG. 7(b). The base of the PNP bipolar transistor is the collector of the NPN bipolar transistor and the collector of the PNP bipolar transistor is the base of the NPN bipolar transistor.

In embodiments of the present disclosure, the SCR device is constructed by interleaving the emitter (P+ region 124) and the base (N+ region 122) in the PNP bipolar transistor, and also interleaving the emitter (N+ region 128) and the base (P+ region 130) in the NPN bipolar transistor.

In embodiments of the present disclosure, the TVS device incorporates structures to enable the trigger voltage of the TVS device to be tuned to the desired voltage level while preserving the low parasitic capacitance and high holding voltage characteristics of the TVS device. Returning to FIG. 3, when the voltage applied to the protected node exceeds the trigger voltage, the N-Well 115 to P-Well 120 junction breaks down and the avalanche current flows to cause one of the NPN or PNP bipolar transistor of the SCR device to turn on. In embodiments of the present disclosure, the TVS device 100 incorporates a trigger voltage adjust structure to adjust or tune the trigger voltage. More specifically, the TVS device 100 includes a heavily doped N+ region 126 formed in the current conducting region between adjacent P-Well 120 and N-Well 115 as the trigger voltage adjust structure.

In the present embodiment, the N+ doped region 126 partially overlaps the P-Well 120 and extends into the N-type epitaxial layer 108 in the current conducting region between the P-Well 120 and N-Well 115.

With the N+ doped region 126 thus provided, the N-Well-to-P-Well junction breaks down at a lower voltage due to the N+ region 126 butting on to the P-Well 120. Accordingly, by providing the N+ doped region 126, the trigger voltage of the TVS device 100 can be lowered. In some embodiments, the trigger voltage of the TVS device can be tuned to the desired level by adjusted the doping level of the N+ region 126 and the P-Well 120.

In the present embodiment, the N+ doped region 126 is configured in a rectangular shape, as shown in the layout view in FIG. 4. In alternate embodiments, the N+ doped region 126 can be configured in other shapes suitable for tuning the trigger voltage of the TVS device. In other embodiments, two or more N+ doped regions 126 can be provided along the current conduction region (that is, in the Z direction in FIG. 4) to provide additional tuning or adjustment of the trigger voltage. The N+ doped region 126 is optional and may be omitted in other embodiments of the present disclosure.

Figure 8:
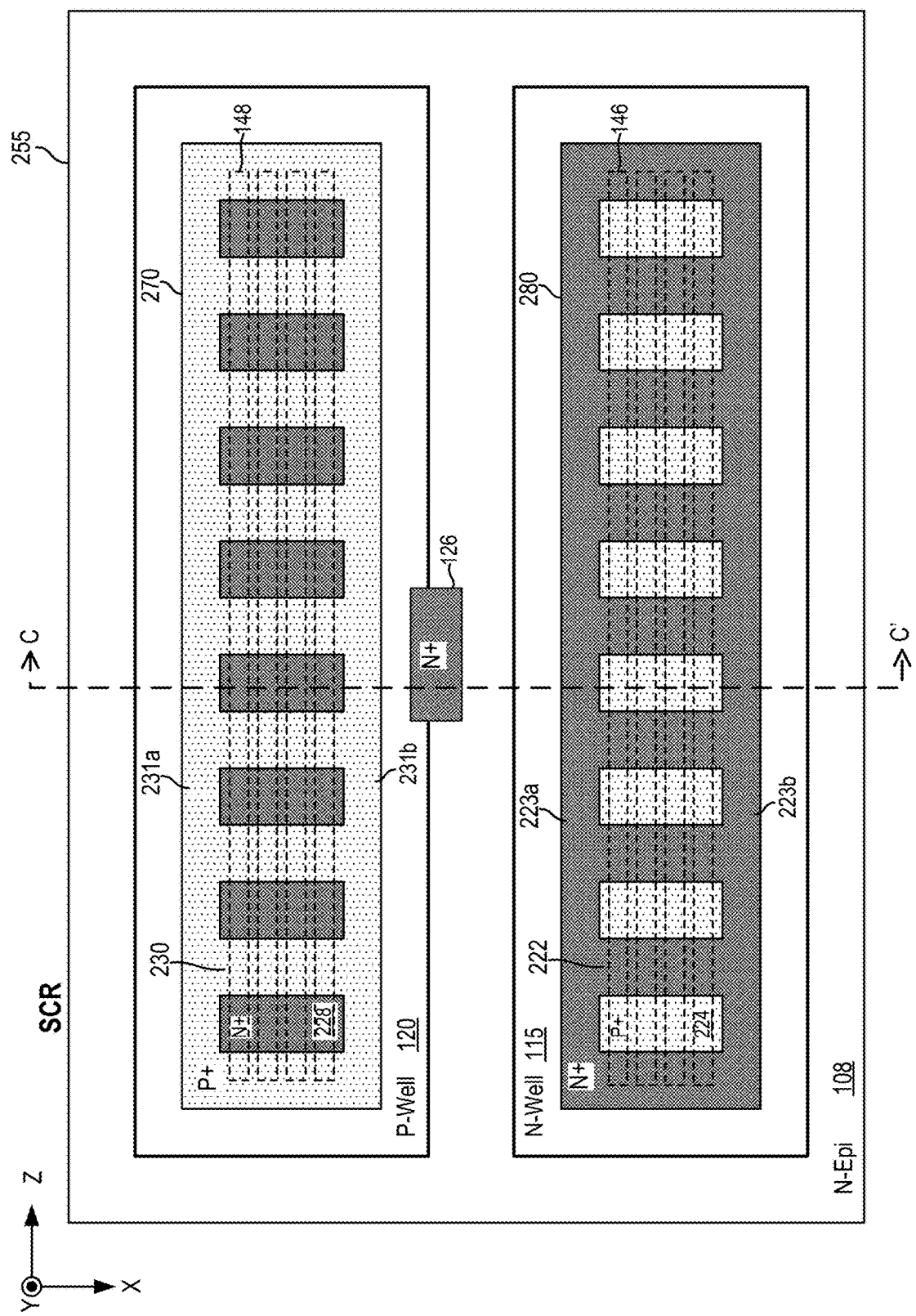
FIG. 8 is a layout view of the SCR device in the TVS protection device in alternate embodiments of the present disclosure.
Figure 9:
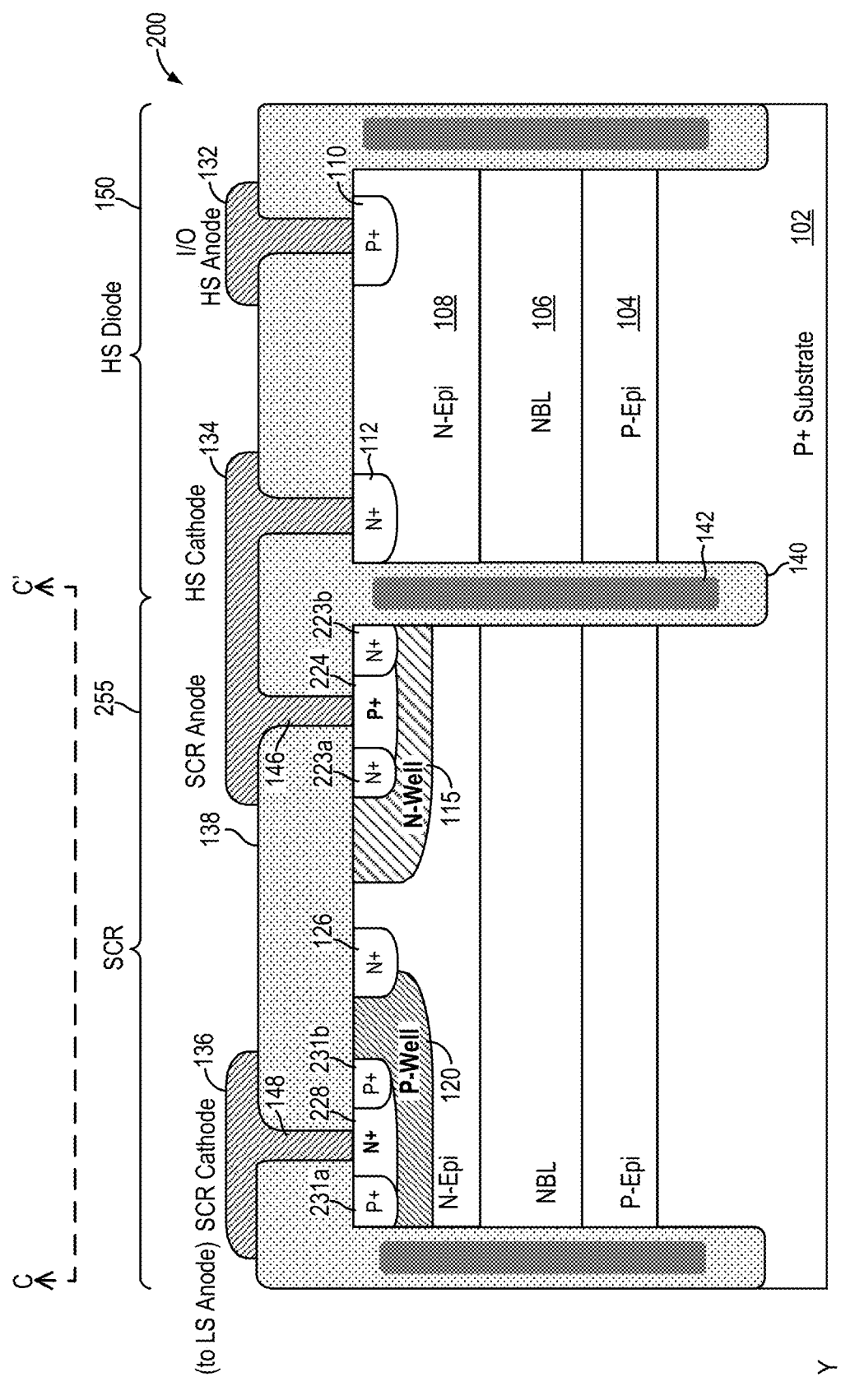
FIG. 9 is a cross-sectional view of the TVS protection device in FIG. 8 along the line C-C' in embodiments of the present disclosure.

FIG. 8 is a layout view of the SCR device in the TVS protection device in alternate embodiments of the present disclosure. FIG. 9 is a cross-sectional view of the TVS protection device in FIG. 8 along the line C-C' in embodiments of the present disclosure. Like elements in FIGS. 8 and 9 and previous figures are given like reference numerals to simplify the discussion. Referring to FIGS. 8 and 9, a TVS device 200 is formed using a SCR clamp device 255 with modified base body contact regions. In the present embodiment, the SCR clamp device 255 includes a heavily doped P+ region 270 formed in the P-Well 120 that is configured to interleave and encircle the N+ regions 228, also formed in the P-Well 120. As shown in FIG. 9, the P+ region 270 includes portions 230 that interleave with the N+ regions 228 in the second (Z) direction. The P+ region 270 further includes portions 231a and 231b that extend in the second (Z) direction and formed along the two opposing sides of the N+ regions 228 not in contact with the P+ portions 230. As thus configured, the P+ region 270 is formed along the perimeter of the N+ regions 228 and encloses all of the N+ regions 228.

A corresponding structure for the N+ region in the N-Well 115 is also formed. In the present embodiment, the SCR clamp device 255 includes a heavily doped N+ region 280 formed in the N-Well 115 that is configured to interleave and encircle the P+ regions 224, also formed in the N-Well 115. As shown in FIG. 9, the N+ region 280 includes portions 222 that interleave with the P+ regions 224 in the second (Z) direction. The N+ region 280 further includes portions 223a and 223b that extend in the second (Z) direction and formed along the two opposing sides of the P+ regions 224 not in contact with the N+ portions 222. As thus configured, the N+ region 280 is formed along the perimeter of the P+ regions 224 and encloses all of the P+ regions 224.

The cross-sectional view of the SCR 255 in FIG. 9 illustrates the P+ region 270 and the N+ region 280 along the line C-C'. As shown in FIG. 9, the N+ region 228 in P-Well 120 is bordered by the P+ portions 231a and 231b. Meanwhile, the P+ region 224 in N-Well 115 is bordered by the N+ portions 223a and 223b. As thus configured, by using the P+ region 270 and N+ region 280 to enclose the respective emitter regions of the SCR device, the holding voltage of the SCR is improved by rendering it more difficult to turn on the SCR device.

Returning to FIGS. 3 and 4, the SCR device in the TVS device of the present disclosure thus constructed can realize a higher holding voltage than conventional SCR devices. In particular, the holding voltage in the SCR device of the present disclosure can be tuned to any required voltage by adjusting various parameters of the SCR device.

First, the holding voltage of the SCR device can be tuned by adjusting the length and the width of the emitter region and the base body contact regions. That is, the length and/or width of the interleaving emitter/base body contact regions can be adjusted to achieve the desired holding voltage. Referring to FIG. 4, in some embodiments, the width of the N+ regions 128, 122, as measured in the second (Z) direction or the width of the P+ regions 130, 124 (in the Z direction) can be adjusted to tune the holding voltage. In another embodiment, the length of the N+ regions 128, 122, as measured in the first (X) direction or the length of the P+ regions 130, 124 (in the X direction) can be adjusted to tune the holding voltage.

In particular, in some embodiments, the length of the emitter regions (N+ region 128 and P+ region 124) can be made shorter than the base body contact regions (P+ region 130 and N+ region 122) to tune the holding voltage. Such a configuration will increase the holding voltage as the emitter area is reduced. FIG. 8 illustrates one example embodiment where the emitter regions (N+ region 228 and P+ region 224) are configured to have a shorter length (in the X direction) than the base contact regions (P+ portion 230 and N+ portion 222).

Finally, by forming a ring of base body contact region around the emitter region, as shown in FIG. 8, the base currents of the NPN/PNP bipolar transistors in the SCR are interrupted, which will also increase the holding voltage of the SCR.

In the above described embodiments, the P-Well 120 and the N-Well 115 in the SCR device are formed spaced apart in the N-type Epitaxial layer 108 in the first (X) direction. Separating the P-Well and the N-Well has the advantages of lowering the capacitance of the SCR device, thereby lowering the capacitance of the TVS device in the blocking mode. In an alternate embodiment of the present disclosure, the N-Well 115 and the P-Well 120 in the SCR device can be formed butting or close to each other as the capacitance is not as critical since the SCR device is placed in series with the low capacitance high-side steering diode.

Figure 10A:
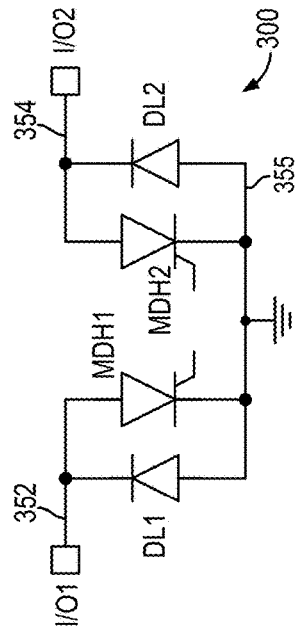
FIG. 10(a), is a circuit diagram and a cross-sectional view of a TVS protection device in alternate embodiments of the present disclosure.
Figure 10:
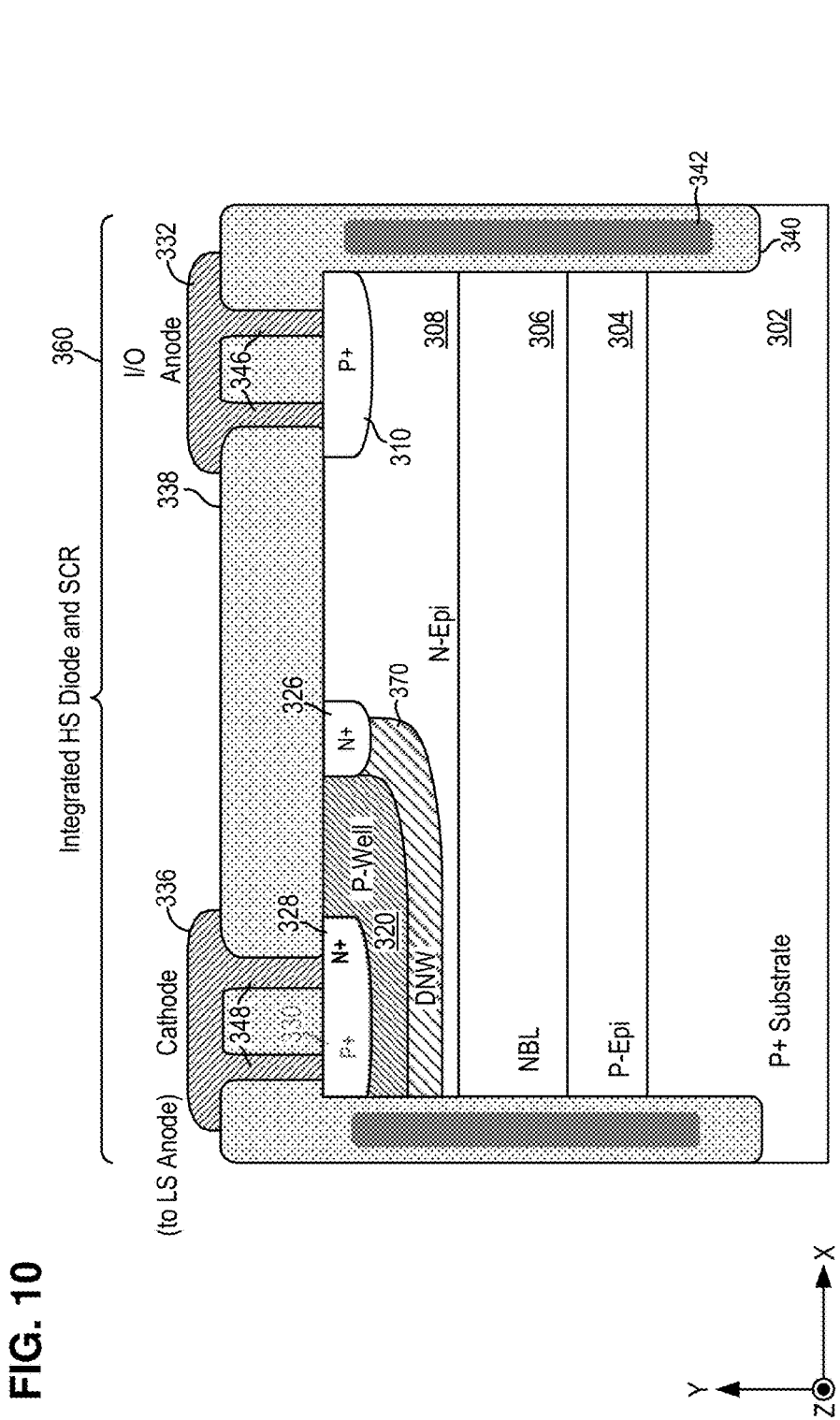
FIG. 10, which includes

FIG. 10, which includes FIG. 10(*a*), is a circuit diagram and a cross-sectional view of a TVS protection device in alternate embodiments of the present disclosure. In particular, FIG. 10 illustrates the cross-sectional view of a merged high-side steering diode ("HS diode") and SCR clamp device in the TVS protection device in embodiments of the present disclosure. In the present figure, the low-side steering diode is omitted to simplify the discussion. It is understood that FIG. 10 illustrates only a part of the TVS protection device and that the TVS protection device includes other elements not shown in the cross-sectional view of FIG. 10.

In the above described embodiments, the high-side steering diode and the SCR clamp device are formed as separate devices in separate active regions. In the present embodiment, the high-side steering diode and SCR clamp device are integrated together and formed in a single active region so as to achieve a compact device layout and to allow the TVS device to fit into a small footprint package. FIG. 10(*a*) is a circuit diagram of a TVS protection device incorporating an integrated high-side diode and SCR clamp device in embodiments of the present disclosure. Referring to FIG.

10(a), a TVS protection device 300 ("TVS device 300") includes two sets of steering diodes coupled to provide surge protection for two input-output (I/O) terminals I/O1 and I/O2. Each set of steering diodes include a low-side steering diode and an integrated high-side diode and SCR clamp device. More specifically, a low-side steering diode DL1 and an integrated high-side diode/SCR MDH1 are connected in parallel between the I/O terminal I/O1 (node 352) (the protected node) and a node 355. Meanwhile, a low-side steering diode DL2 and an integrated high-side diode/SCR MDH2 are connected in parallel between the I/O terminal I/O2 (node 354) (the protected node) and the node 355. In the present embodiment, the node 355 is connected to the ground potential and the TVS device 300 is a unidirectional TVS device. In other embodiments, the node 355 can be left floating to form a bidirectional TVS device.

More specifically, the I/O terminal I/O1 is connected to the anode of the integrated high-side diode/SCR MDH1 and to the cathode of the low-side steering diode DL1. Similarly, the I/O terminal I/O2 is connected to the anode of the integrated high-side diode/SCR MDH2 and to the cathode of the low-side steering diode DL2. The cathode terminal of the integrated high-side diode/SCR MDH1 is connected to the node 355 which also connects to the cathode of the integrated high-side diode/SCR MDH2. The anode terminals of the low-side steering diodes DL1 and DL2 are both connected to the node 355.

Referring to FIG. 10, an integrated high-side diode and SCR clamp device 360 ("integrated HS diode/SCR device") is formed in an active region of a semiconductor structure formed by a P+ substrate 302, a P-type epitaxial layer 304, an N-type buried layer 306 and an N-type epitaxial layer 308. The active region is isolated from other active regions on the semiconductor structure by isolation structures 340. In the present embodiment, the isolation structures 340 are formed as oxide lined trenches filled with a polysilicon layer 342 and the trenches extend to the P+ substrate 302. In other embodiments, the trench isolation structures 340 can be formed as oxide filled trenches.

The integrated HS diode/SCR device 360 includes a heavily doped P+ region 310 formed in the N-type epitaxial layer 308. The P+ region 310 forms the anode of the high-side steering diode and also the anode of the SCR device. The integrated HS diode/SCR device 360 includes a P-Well 320 formed in a deep N-Well (DNW) 370, both spaced apart from the P+ region 310 in the semiconductor structure in the first direction (X direction). A heavily doped N+ region 328 and a heavily doped P+ region 330 are formed in the P-Well 320. In particular, N+ region 328 and P+ region 330 are arranged as alternating doped region interleaving in the second direction (Z direction) on the major surface of the semiconductor structure. In FIG. 10, black ink and gray ink are used to depict N+ region 328 and P+ region 330 as alternating doped regions in the Z direction in the cross-sectional view in the X-Y plane. In the integrated structure, the SCR includes alternating emitter and base regions only in the NPN bipolar transistor of the PNPN structure.

In the integrated HS diode/SCR device 360, the NPN bipolar transistor of the SCR device is formed by the N+ region 328 as the emitter, the P-Well as the base (P+ region 330 as the base body contact) and the N-type epitaxial layer 308 as the collector. The PNP bipolar transistor of the SCR device is formed with the P+ region 310 as the emitter, the N-type epitaxial layer 308 as the base and the P-Well 320 as the collector. In the integrated HS diode/SCR device 360, the deep N-Well 370 is provided to prevent punch through of the PNP bipolar transistor of the SCR device. In particular, because the N-type epitaxial layer 308 is lightly doped, in operation, the depletion region at the junction of the P+ region 310 and the N-type epitaxial layer 308 will extend into the lightly doped side—that is, the N-Epi layer. If the depletion region is allowed to extend all the way to the P-Well 320, punch-through of the PNP bipolar transistor occurs, and the PNP transistor will no longer be able to provide blocking function. In the present embodiment, a deep N-Well 370 is formed at the same location as P-Well 320. The deep N-Well 370 extends beyond the P-Well 320 into the N-type epitaxial layer 308, thereby encircling the P-Well 320. The deep N-Well 370 has the function of stopping the depletion region, originating from the junction at the P+ region 310 and N-Epi 308, from reaching the P-Well 320. In one embodiment, the deep N-Well 370 is more heavily doped than the N-type epitaxial layer 308 and the P-Well 320 is more heavily doped than the deep N-Well 370.

In the present embodiment, the integrated HS diode/SCR device 360 further includes a heavily doped N+ region 326 as the trigger voltage adjust structure for tuning the trigger voltage of the TVS device. The N+ region 326 is placed adjacent the P-Well 320 and may overlap the P-Well 320 in some embodiments. In the present embodiment, the N+ region 326 is formed at least partially in the deep N-Well 370. The N+ doped region 326 is optional and may be omitted in other embodiments of the present disclosure.

Figure 11:
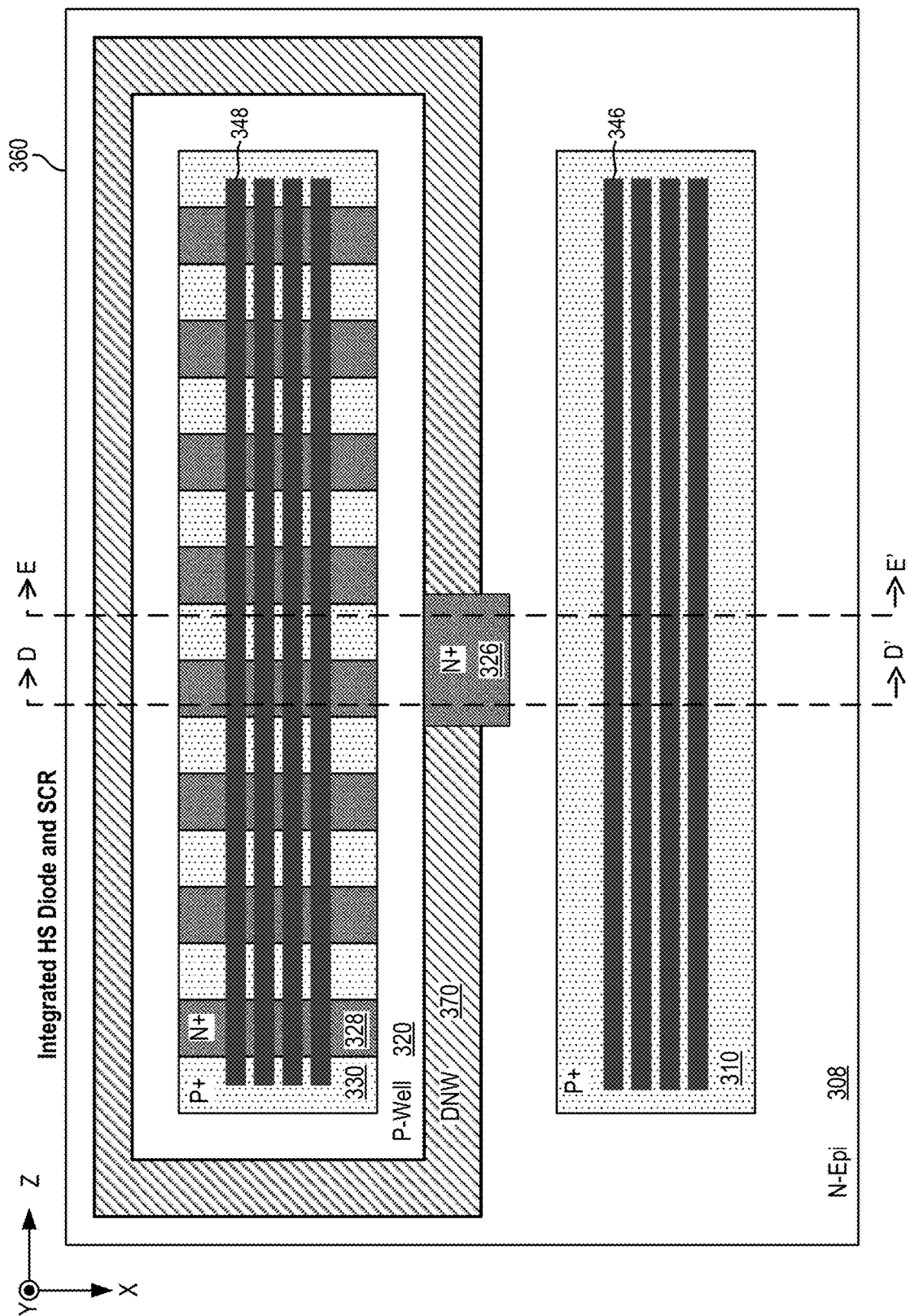
FIG. 11 is a layout view of the integrated HS diode/SCR device in the TVS protection device of FIG. 10 in some embodiments.
Figure 12:
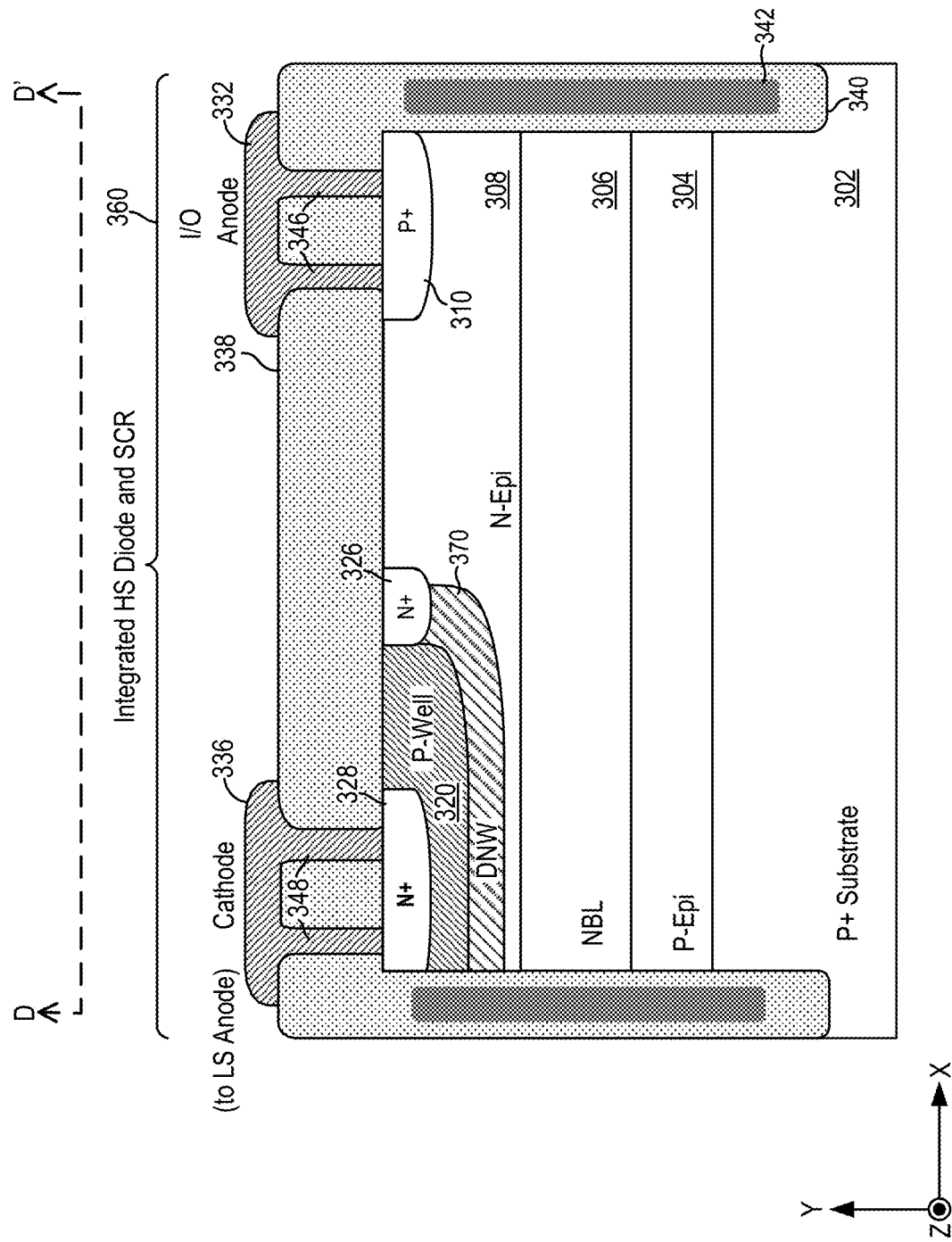
FIG. 12 is a cross-sectional view of the TVS protection device in FIG. 11 along the line D-D' in embodiments of the present disclosure.
Figure 13:
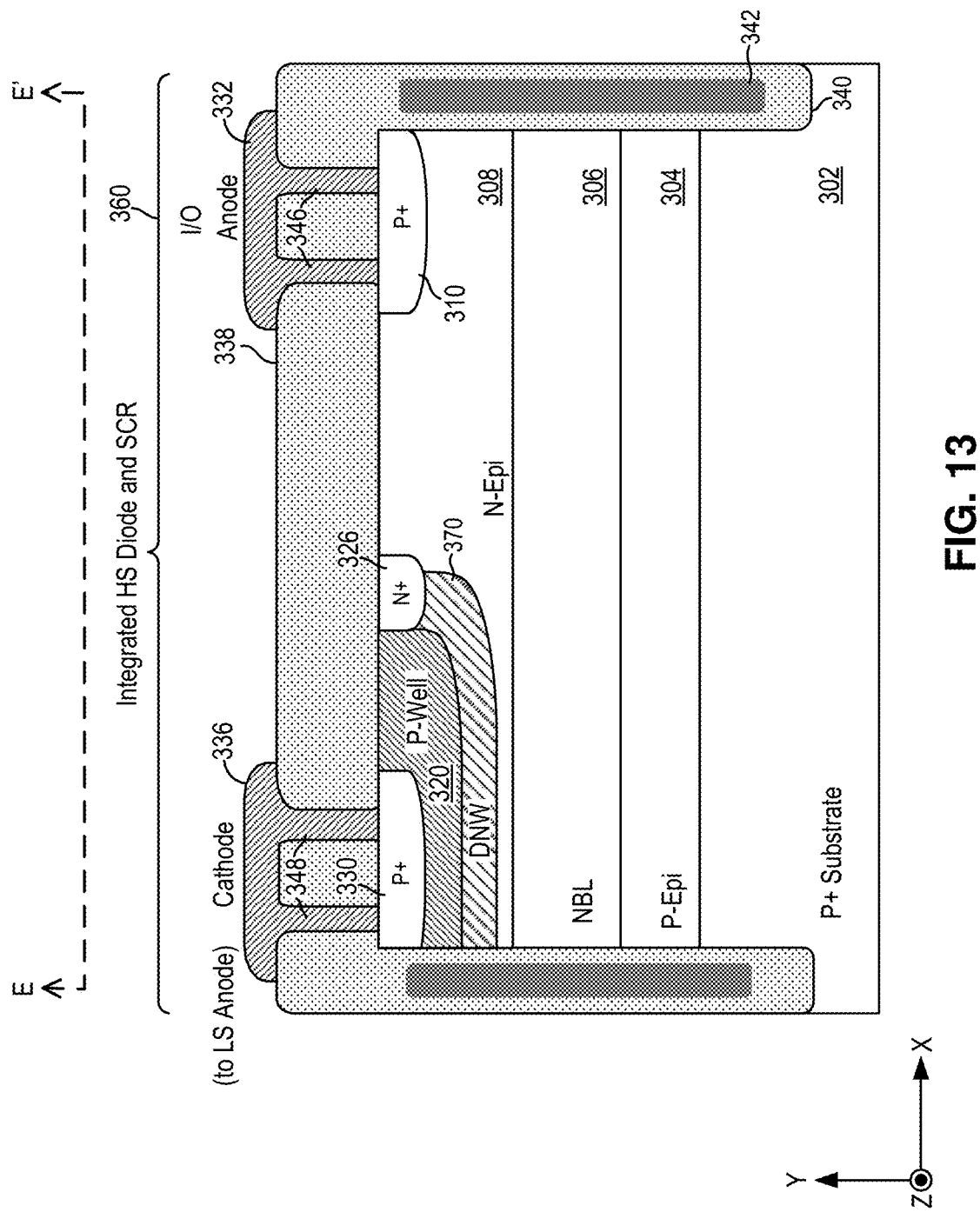
FIG. 13 is a cross-sectional view of the TVS protection device in FIG. 11 along the line E-E' in embodiments of the present disclosure.

FIG. 11 is a layout view of the integrated HS diode/SCR device in the TVS protection device of FIG. 10 in some embodiments. The layout view in FIG. 11 illustrates the integrated HS diode/SCR device from the third direction and depicts structures in the X-Z plane. Like elements in FIGS. 10 and 11 are given like reference numerals to simplify the discussion. FIG. 12 is a cross-sectional view of the TVS protection device in FIG. 11 along the line D-D' in embodiments of the present disclosure. FIG. 13 is a cross-sectional view of the TVS protection device in FIG. 11 along the line E-E' in embodiments of the present disclosure.

Referring first to FIG. 11, the integrated HS diode/SCR device 360 includes the P+ region 310 as the anode for both the high-side steering diode and the SCR device. The alternating P+ region 330 and N+ region 328 are formed in the P-Well 320 which is formed in a deep N-Well 370. Along the line D-D', the integrated HS diode/SCR device 360 includes the N+ region 328 formed in the P-Well 320, as shown in FIG. 12. Along the line E-E', the integrated HS diode/SCR device 360 includes the P+ region 330 formed in the P-Well 320, as shown in FIG. 13. As thus configured, a compact layout for the integrated HS diode/SCR device 360 is achieved.

Figure 14:
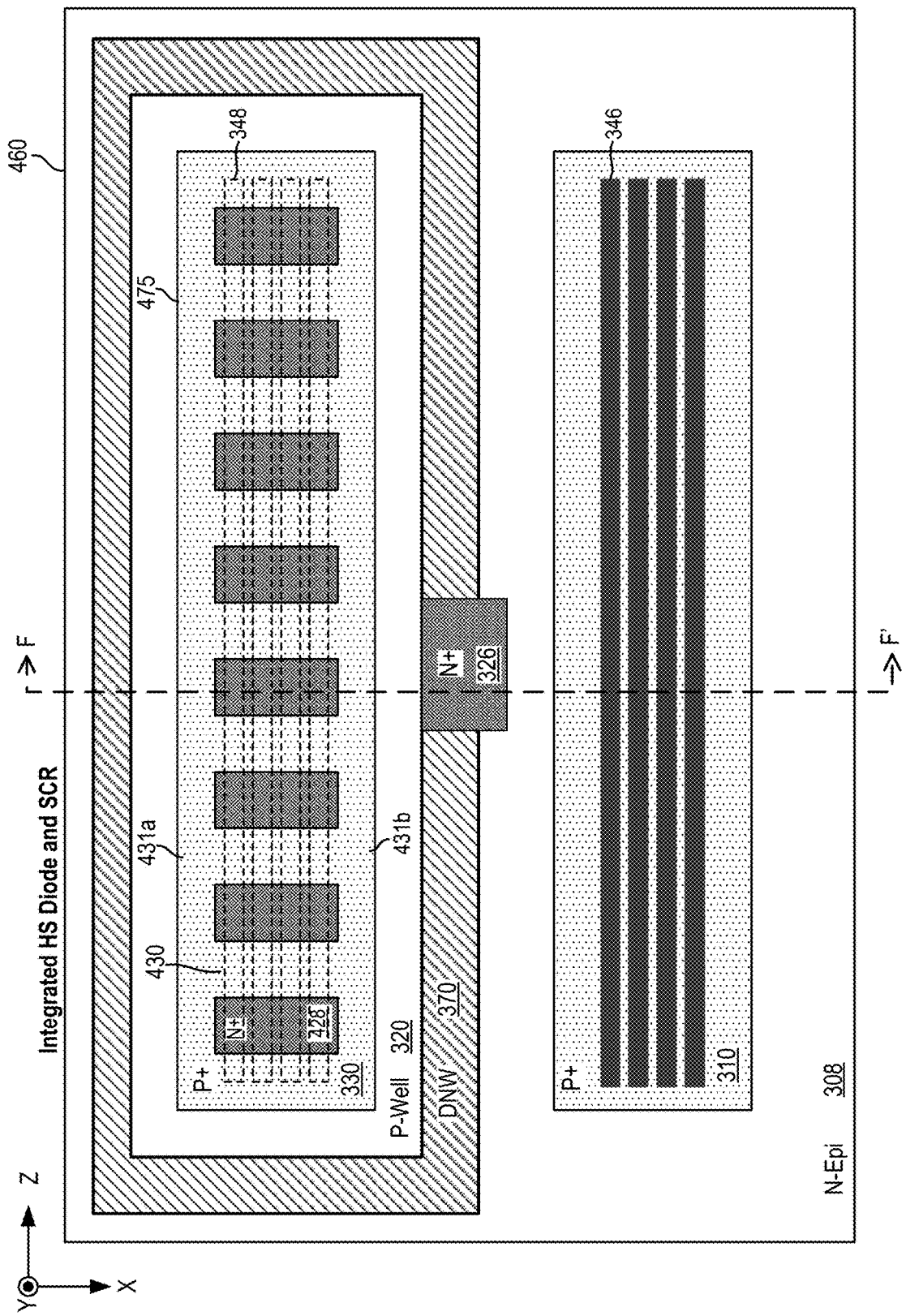
FIG. 14 is a layout view of the integrated HS diode/SCR device in the TVS protection device in alternate embodiments of the present disclosure.
Figure 15:
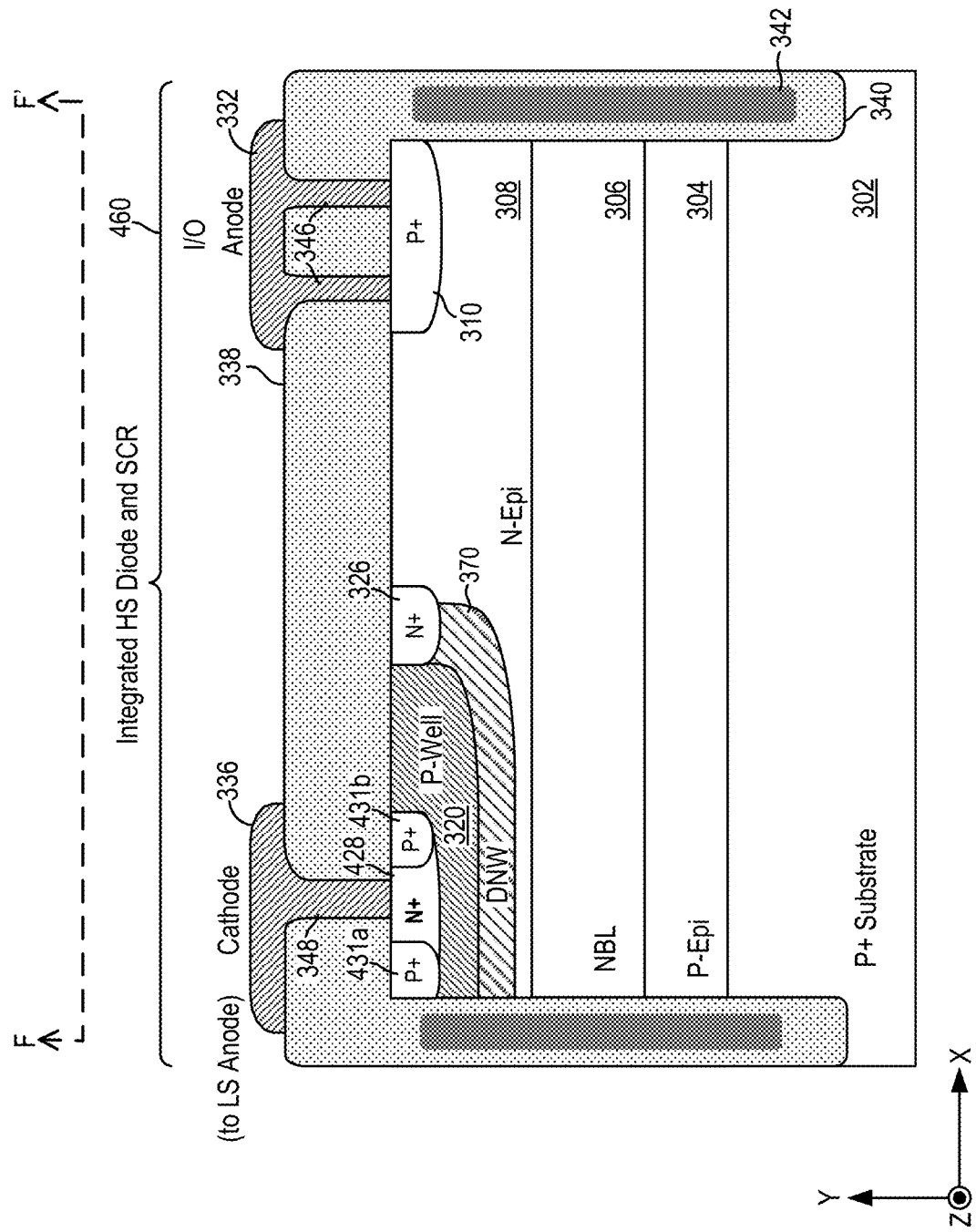
FIG. 15 is a cross-sectional view of the TVS protection device in FIG. 14 along the line F-F' in embodiments of the present disclosure.

FIG. 14 is a layout view of the integrated HS diode/SCR device in the TVS protection device in alternate embodiments of the present disclosure. FIG. 15 is a cross-sectional view of the TVS protection device in FIG. 14 along the line F-F' in embodiments of the present disclosure. Referring to FIGS. 14 and 15, an integrated HS diode/SCR device 460 is constructed in a similar manner as the SCR device in FIG. 8 using modified base body contact regions where the alternating emitter and base regions are formed by enclosing the emitter region by the base body contact region.

In the present embodiment, the integrated HS diode/SCR device 460 includes a heavily doped P+ region 475 formed in the P-Well 320 that is configured to interleave and encircle the N+ regions 428, also formed in the P-Well 320. As shown in FIG. 14, the P+ region 475 includes portions 430 that interleave with the N+ regions 428 in the second (Z)

direction. The P+ region 475 further includes portions 431*a* and 431*b* that extend in the second (Z) direction and formed along the two opposing sides of the N+ regions 428 not in contact with the P+ portions 430. As thus configured, the P+ region 475 is formed along the perimeter of the N+ regions 428 and encloses all of the N+ regions 428.

The cross-sectional view of the integrated HS diode/SCR device 460 in FIG. 15 illustrates the P+ region 475 and the N+ region 428 along the line F-F'. As shown in FIG. 15, the N+ region 428 in P-Well 320 is bordered by the P+ portions 431*a* and 431*b*. By using the P+ region 475 to enclose the emitter region (N+ region 428) of the SCR device, the holding voltage of the SCR is improved by rendering it more difficult to turn on the SCR device.

Figure 16:
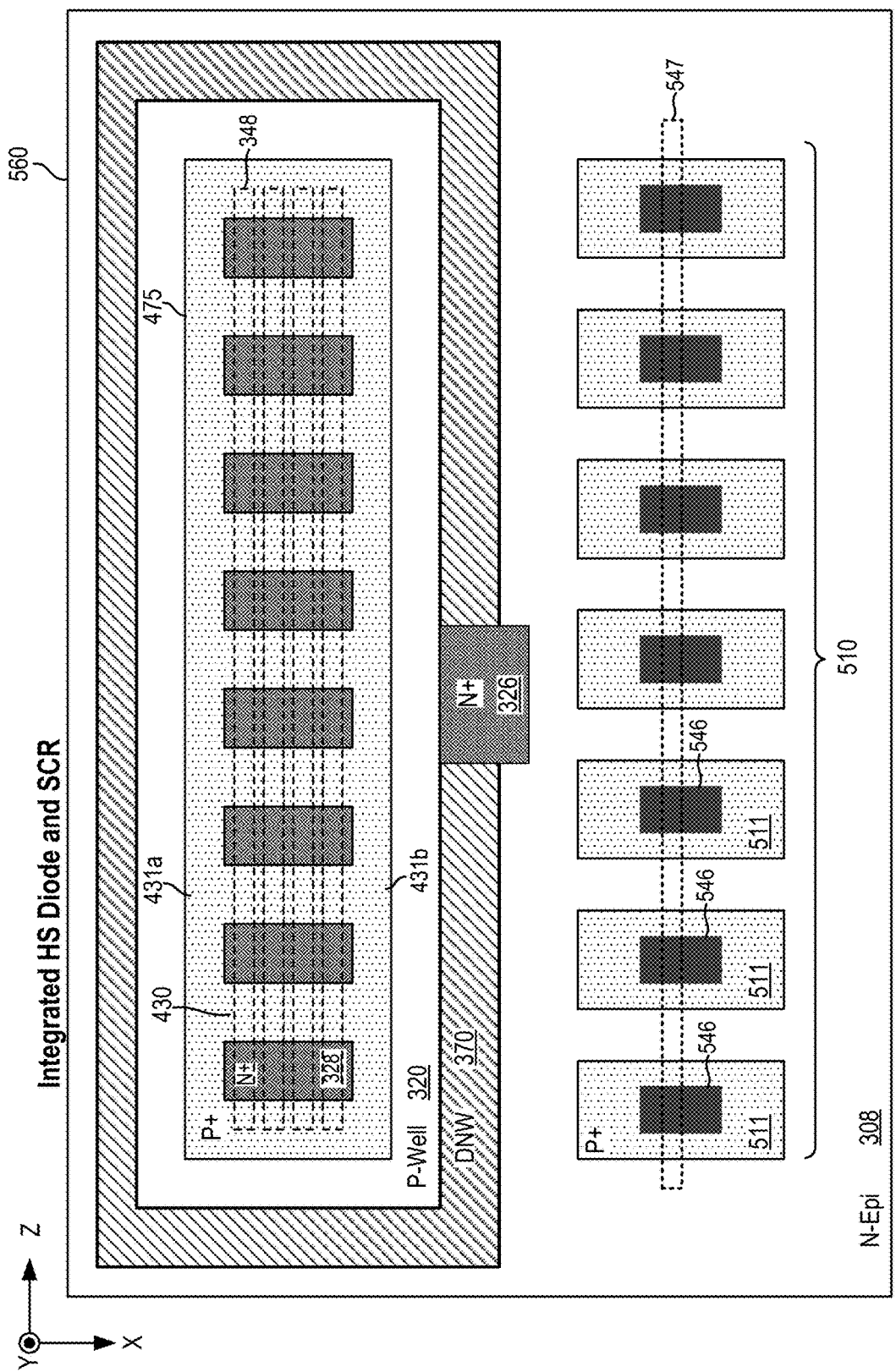
FIG. 16 is a layout view of the SCR device in the TVS protection device of FIG. 10 in alternate embodiments of the present disclosure.

In the embodiment shown in FIGS. 11 and 14, the P+ region 310 is formed as a single doped region extending in the Z direction, that is, extending for the entire width of the integrated HS diode/SCR device. In other embodiments, the P+ region 310 can be configured in other manners. FIG. 16 is a layout view of the SCR device in the TVS protection device of FIG. 10 in alternate embodiments of the present disclosure. Like elements in FIGS. 14 and 16 are given like reference numerals to simplify the discussion. Referring to FIG. 16, an integrated HS diode/SCR device 560 includes a heavily doped P+ region 510 formed by multiple P+ regions 511 formed along the second (Z) direction. Each P+ region 511 has a contact 546 formed thereon for making electrical contact to the P+ region. A conductive layer, such as a metal line 547, can be used to electrically connect the contacts 546 of all the P+ regions 511 together. The configuration of the P+ regions 511 in FIG. 16 can also be applied to the embodiment shown in FIG. 11 in some embodiments.

The invention can be implemented in numerous ways, including as a process; an apparatus; a system; and/or a composition of matter. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

The above detailed descriptions are provided to illustrate specific embodiments of the present invention and are not intended to be limiting. Numerous modifications and variations within the scope of the present invention are possible. The present invention is defined by the appended claims.

The invention claimed is:

1. A transient voltage suppressing (TVS) device comprising:
 a semiconductor layer comprising a first epitaxial layer of a first conductivity type;
 a plurality of active regions formed in the semiconductor layer, the active regions being isolated from each other by isolation structures;
 a high-side steering diode formed in a first active region and having an anode terminal coupled to a first protected node and a cathode terminal; and
 a clamp device formed in a second active region of the plurality of active regions, the clamp device comprising a silicon controlled rectifier (SCR) having an anode terminal coupled to the cathode terminal of the high-side steering diode and a cathode terminal, the silicon controlled rectifier comprising:
 a first well of the first conductivity type formed in the first epitaxial layer;
 a second well of a second conductivity type, opposite to the first conductivity type, formed in the first epitaxial layer adjacent and spaced apart to the first well in a first direction on a major surface of the semiconductor layer;
 a first region of the first conductivity type and a second region of the second conductivity type formed in the first well and being more heavily doped than the first well, the first and second regions being electrically connected and forming the anode terminal of the SCR; and
 a third region of the first conductivity type and a fourth region of the second conductivity type formed in the second well and being more heavily doped than the second well, the third and fourth regions being electrically connected and forming the cathode terminal of the SCR,
 wherein the first and second regions are arranged as alternating doped regions in the first well along a second direction on the major surface of the semiconductor layer and orthogonal to the first direction, and the third and fourth regions are arranged as alternating doped regions in the second well along the second direction, the third region being arranged coplanar with the second region in the second direction and the fourth region being arranged coplanar with the first region in the second direction.

2. The TVS device of claim 1, further comprising a low-side steering diode formed in a third active region of the plurality of active regions and having a cathode terminal coupled to the first protected node and an anode terminal coupled to the cathode terminal of the SCR.

3. The TVS device of claim 2, wherein the high-side steering diode comprises a PN junction diode and the low-side steering diode comprises a punch-through silicon controlled rectifier.

4. The TVS device of claim 1, further comprising a fifth region of the first conductivity type formed in the first epitaxial layer and overlapping the second well, the fifth region being more heavily doped than the second well.

5. The TVS device of claim 1, wherein the first and second regions in the first well are electrically connected through a first contact and the third and fourth regions in the second well are electrically connected through a second contact.

6. The TVS device of claim 1, wherein the semiconductor layer further comprises a second epitaxial layer of the second conductivity type and a first buried layer of the first conductivity type formed on the second epitaxial layer, wherein the first epitaxial layer is formed on the first buried layer.

7. The TVS device of claim 6, wherein the isolation structures comprise a plurality of trench isolation structures isolating the active regions, each trench isolation structures extending from the first epitaxial layer to the second epitaxial layer.

8. The TVS device of claim 1, wherein the high-side steering diode comprises a PN junction diode, the PN junction diode comprising:
a sixth region of the second conductivity type formed in the first active region of the first epitaxial layer; and
a seventh region of the first conductivity type formed in the first epitaxial layer spaced apart from the sixth region.

9. The TVS device of claim 1, wherein the first conductivity type comprises N-type conductivity and the second conductivity type comprises P-type conductivity.

10. The TVS device of claim 1, further comprising:
eighth and ninth regions of the first conductive type formed in the first well and extending in the second direction adjacent to the alternating first and second regions, the second region being surrounded by the first region, the eighth region and the ninth region in the first and second directions; and
tenth and eleventh regions of the second conductive type formed in the second well and extending in the second direction adjacent to the alternating third and fourth regions, the third region being surrounded by the fourth region, the tenth region and the eleventh region in the first and second directions.

11. The TVS device of claim 1, wherein the cathode terminal of the SCR is electrically connected to a ground potential.

12. The TVS device of claim 1, wherein the second region has a length in the first direction shorter than a length of the first region, and the third region has a length in the first direction shorter than the length of the fourth region.

13. The TVS device of claim 1, wherein the first region and the second region have the same length in the first direction, and the third region and the fourth region have the same length in the first direction.

14. The TVS device of claim 1, wherein the first region and the second region are formed as striped doped regions arranged alternating in the second direction in the first well, and the third region and the fourth region are formed as striped doped regions arranged alternating in the second direction in the second well.

15. The TVS device of claim 1, wherein the SCR has a current path between the anode terminal and the cathode terminal in the first direction, whereas the first and second regions are arranged as alternating doped regions in the first well along the second direction orthogonal to the current path of the SCR, and the third and fourth regions are arranged as alternating doped regions in the second well along the second direction orthogonal to the current path of the SCR.

16. The TVS device of claim 1, wherein the SCR is in the blocking mode in response to the voltage at the first protected node being less than a breakdown voltage of the SCR, the SCR providing a capacitance value less than 0.2 pF at the first protected node.

17. The TVS device of claim 1, wherein the SCR is in a conductive mode in response to the voltage at the first protected node exceeding a breakdown voltage of the SCR, the SCR snaps back to a holding voltage greater than an operating voltage of the first protected node.

18. The TVS device of claim 17, wherein in response to the voltage at the first protected node exceeding the breakdown voltage of the SCR, the SCR snaps back to the holding voltage greater than an operating voltage of the first protected node and less than the breakdown voltage of the SCR.

19. The TVS device of claim 4, wherein the SCR has a breakdown voltage being a function of a junction between the first well and the second well, the fifth region of the first conductivity type is positioned in a current conducting region between the first well and the second well to lower the breakdown voltage of the SCR.

20. The TVS device of claim 19, wherein the breakdown voltage of the SCR is adjusted in response to a doping level of the fifth region.

21. The TVS device of claim 4, wherein the fifth region comprises a plurality of doped regions of the first conductivity type formed in the first epitaxial layer and overlapping the second well, the plurality of doped regions being more heavily doped than the second well.

22. The TVS device of claim 21, wherein the SCR has a breakdown voltage being a function of a junction between the first well and the second well, the plurality of doped regions of the fifth region are positioned in a current conducting region between the first well and the second well to lower the breakdown voltage of the SCR.

* * * * *